(12) United States Patent
Park et al.

(10) Patent No.: US 12,256,567 B2
(45) Date of Patent: Mar. 18, 2025

(54) SEMICONDUCTOR DEVICE WITH MULTIPLE GATE ELECTRODES FEATURING ASYMMETRIC CONTACT WIDTHS

(71) Applicant: SAMSUNG ELECTRONICS CO., LTD., Suwon-si (KR)

(72) Inventors: Sang-Wook Park, Hwaseong-si (KR); Yun Kyoung Song, Hwaseong-si (KR); Bong Keun Kim, Seoul (KR); Se Jin Park, Seoul (KR)

(73) Assignee: SAMSUNG ELECTRONICS CO., LTD. (KR)

(*) Notice: Subject to any disclaimer, the term of this patent is extended or adjusted under 35 U.S.C. 154(b) by 431 days.

(21) Appl. No.: 17/851,857

(22) Filed: Jun. 28, 2022

(65) Prior Publication Data

US 2023/0197803 A1 Jun. 22, 2023

(30) Foreign Application Priority Data

Dec. 22, 2021 (KR) .................... 10-2021-0184542

(51) Int. Cl.
*H10D 84/01* (2025.01)
*H10D 30/43* (2025.01)
(Continued)

(52) U.S. Cl.
CPC ......... *H10D 84/0142* (2025.01); *H10D 30/43* (2025.01); *H10D 30/6729* (2025.01);
(Continued)

(58) Field of Classification Search
CPC ..... H01L 21/823437; H01L 21/823456; H01L 21/823475; H01L 27/0207; H01L 27/088;
(Continued)

(56) References Cited

U.S. PATENT DOCUMENTS 7,122,467 B2 10/2006 Lee et al.
10,445,455 B2 10/2019 Do et al.
(Continued)

FOREIGN PATENT DOCUMENTS

KR 20110025474 A 3/2011
KR 20110090580 A 8/2011

*Primary Examiner* — Cheung Lee
(74) *Attorney, Agent, or Firm* — Myers Bigel, P.A.

(57) ABSTRACT

A semiconductor device includes a first active pattern that extends in a first horizontal direction, a second active pattern which extends in the first horizontal direction, and is spaced apart from the first active pattern by a first distance in a second horizontal direction, a third active pattern which extends in the first horizontal direction, and is spaced apart from the second active pattern by a second distance greater than the first distance in the second horizontal direction, a first gate electrode which extends in the second horizontal direction on the first to third active patterns, a second gate electrode which extends in the second horizontal direction on the first and second active patterns, and is spaced apart from the first gate electrode in the first horizontal direction, a first gate contact and a second gate contact which extends in the second horizontal direction on the second gate electrode.

20 Claims, 21 Drawing Sheets

(51) Int. Cl.
*H10D 30/67* (2025.01)
*H10D 62/10* (2025.01)
*H10D 62/13* (2025.01)
*H10D 64/23* (2025.01)
*H10D 84/03* (2025.01)
*H10D 84/83* (2025.01)

(52) U.S. Cl.
CPC ..... *H10D 30/6735* (2025.01); *H10D 30/6757* (2025.01); *H10D 62/121* (2025.01); *H10D 62/151* (2025.01); *H10D 64/258* (2025.01); *H10D 84/038* (2025.01); *H10D 84/83* (2025.01)

(58) Field of Classification Search
CPC ............. H01L 27/0886; H01L 29/0673; H01L 29/0847; H01L 29/41733; H01L 29/41766; H01L 29/41775; H01L 29/42392; H01L 29/516; H01L 29/66439; H01L 29/775; H01L 29/78391; H01L 29/785; H01L 29/78696; B82Y 10/00; H10D 30/501–509; H10D 30/6729; H10D 30/6735; H10D 84/01; H10D 84/0142; H10D 84/0149; H10D 84/038
See application file for complete search history.

(56) References Cited

U.S. PATENT DOCUMENTS

| | | |
|---|---|---|
| 10,522,423 B2 | 12/2019 | Liaw |
| 10,784,196 B2 | 9/2020 | Lu et al. |
| 10,861,950 B2 | 12/2020 | Sengupta et al. |
| 10,903,239 B2 | 1/2021 | Chang et al. |
| 10,930,568 B1 | 2/2021 | Xie et al. |
| 11,031,336 B2 | 6/2021 | Chang et al. |
| 2020/0097632 A1 | 3/2020 | Lin et al. |
| 2020/0135869 A1 | 4/2020 | Ciou et al. |
| 2021/0233847 A1* | 7/2021 | Kim ...................... H01L 23/535 |

* cited by examiner

SEMICONDUCTOR DEVICE WITH MULTIPLE GATE ELECTRODES FEATURING ASYMMETRIC CONTACT WIDTHS

CROSS-REFERENCE TO RELATED APPLICATION

This application claims priority from Korean Patent Application No. 10-2021-0184542 filed on Dec. 22, 2021 in the Korean Intellectual Property Office and all the benefits accruing therefrom under 35 U.S.C. 119, the contents of which in its entirety are herein incorporated by reference.

BACKGROUND

The present disclosure relates to a semiconductor device. Specifically, the present disclosure relates to a semiconductor device including an MBCFET™ (Multi-Bridge Channel Field Effect Transistor).

In recent years, with the rapid spread of information media, functions of semiconductor devices have also been dramatically developed. In the case of recent semiconductor products, low cost has been desired to secure competitiveness and high integration of products with high quality. The semiconductor devices are being scaled down for high integration.

On the other hand, as a pitch size decreases, there is a need for research for ensuring a decrease in capacitance and electrical stability between contacts inside the semiconductor device.

SUMMARY

Aspects of the present disclosure provide a semiconductor device which secures a contact area between a gate contact and a gate electrode, and reduces an occurrence of a short circuit between the gate contact and a source/drain contact, by disposing the gate contact to extend lengthwise in an extension direction of the gate electrode.

According to some embodiments of the present disclosure, there is provided a semiconductor device, including a first active pattern that extends in a first horizontal direction, a second active pattern which extends in the first horizontal direction, and is spaced apart from the first active pattern by a first distance in a second horizontal direction different from the first horizontal direction, a third active pattern which extends in the first horizontal direction, and is spaced apart from the second active pattern by a second distance greater than the first distance in the second horizontal direction, a first gate electrode which extends in the second horizontal direction on the first to third active patterns, a second gate electrode which extends in the second horizontal direction on the first and second active patterns, and is spaced apart from the first gate electrode in the first horizontal direction, a first gate contact which is on the first gate electrode and in direct contact with the first gate electrode, and a second gate contact which extends in the second horizontal direction on the second gate electrode, is in direct contact with the second gate electrode, and has a width in the first horizontal direction that is less than a width in the second horizontal direction.

According to some embodiments of the present disclosure, there is provided a semiconductor device, including a first active pattern which extends in a first horizontal direction, a second active pattern which extends in the first horizontal direction, and is spaced apart from the first active pattern by a first distance in a second horizontal direction different from the first horizontal direction, a third active pattern which extends in the first horizontal direction, and is spaced apart from the second active pattern by a second distance greater than the first distance in the second horizontal direction, a first gate electrode which extends in the second horizontal direction on the first and second active patterns, a second gate electrode which extends in the second horizontal direction on the third active pattern, and is spaced apart from the first gate electrode in the second horizontal direction, a first source/drain region on the first active pattern on a first side of the first gate electrode, a second source/drain region on the third active pattern on a first side of the second gate electrode, a source/drain contact on the first and second source/drain regions, in direct contact with each of the first and second source/drain regions, the source/drain contact includes a first portion and a second portion protruding from the first portion in a vertical direction, and a first gate contact which extends in the second horizontal direction on the first gate electrode, is in direct contact with the first gate electrode, has a width in the first horizontal direction less than a width in the second horizontal direction, and overlaps the first portion of the source/drain contact in the first horizontal direction.

According to some embodiments of the present disclosure, there is provided a semiconductor device, comprising a first active pattern which extends in a first horizontal direction, a second active pattern which extends in the first horizontal direction, and is spaced apart from the first active pattern by a first distance in a second horizontal direction different from the first horizontal direction, a third active pattern which extends in the first horizontal direction, and is spaced apart from the second active pattern by a second distance greater than the first distance in the second horizontal direction, a first plurality of nanosheets stacked on the first active pattern which are spaced apart from each other in a vertical direction, a second plurality of nanosheets stacked on the third active pattern which are spaced apart from each other in the vertical direction, a first gate electrode which extends in the second horizontal direction on the first to third active patterns, and surrounds the first and second plurality of nanosheets, a second gate electrode which extends in the second horizontal direction on the first and second active patterns, is spaced apart from the first gate electrode in the first horizontal direction, and surrounds the first plurality of nanosheets in the second horizontal direction, a first source/drain region on the first active pattern between the first gate electrode and the second gate electrode, a second source/drain region on the third active pattern on a first side of the first gate electrode, a source/drain contact which is on the first and second source/drain regions, in direct contact with each of the first and second source/drain regions, the source/drain contact includes a first portion and a second portion protruding from the first portion in the vertical direction, a first gate contact which extends in the second horizontal direction on the first gate electrode, is in direct contact with the first gate electrode, and has a width in the first horizontal direction less than a width in the second horizontal direction, and a second gate contact which extends in the second horizontal direction on the second gate electrode, is in direct contact with the second gate electrode, has a width in the first horizontal direction less than a width in the second horizontal direction, and overlaps each of the first and second active patterns in the vertical direction.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
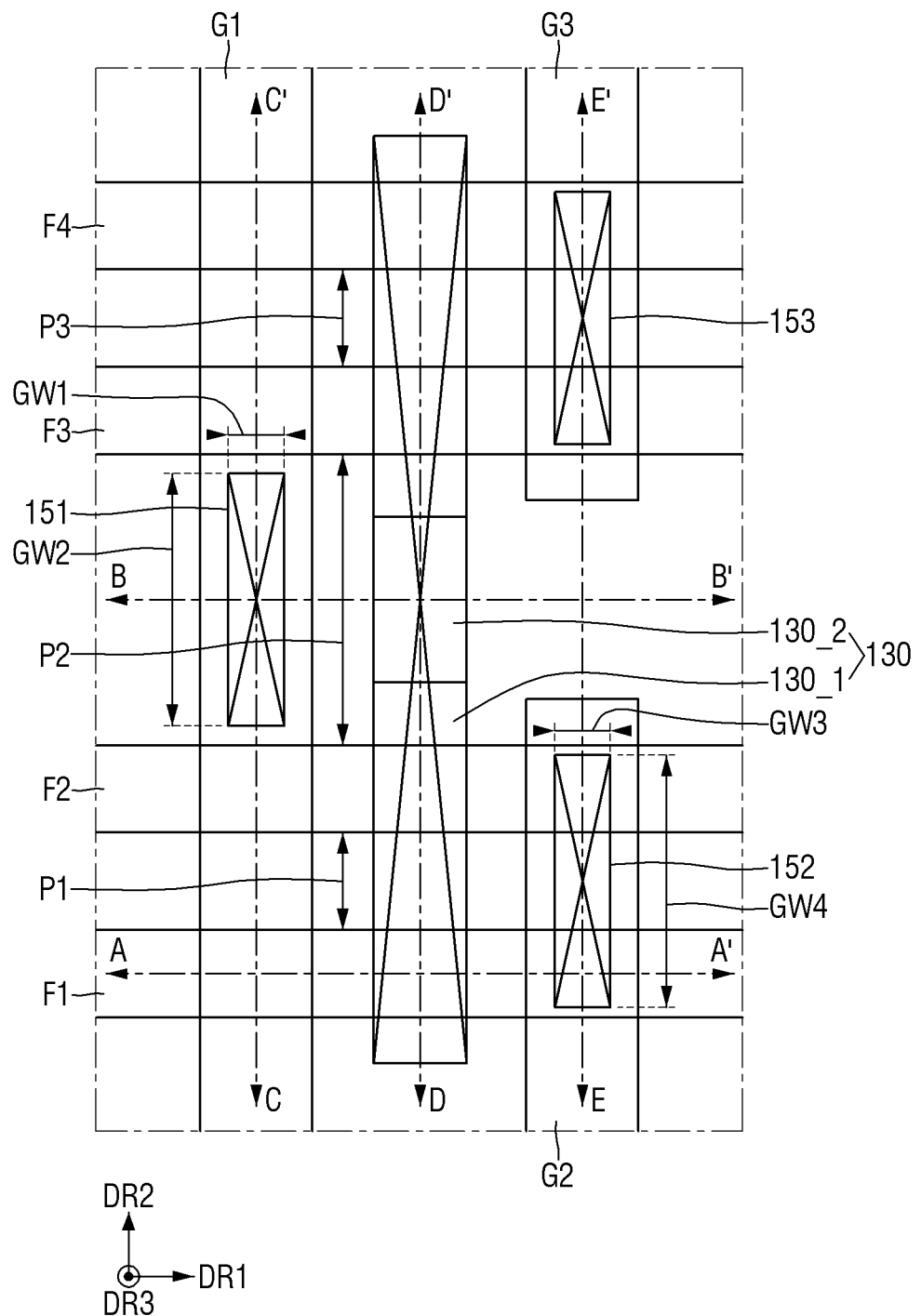
FIG. 1 is a layout diagram for explaining a semiconductor device according to some embodiments of the present inventive concepts.

In the drawings relating to the semiconductor device according to some embodiments, although an example which includes an MBCFET™ (Multi-Bridge Channel Field Effect Transistor) including nanosheets and a fin-shaped transistor (FinFET) including a channel region of a fin-shaped pattern shape will be described, the present disclosure is not limited thereto.

Hereinafter, a semiconductor device according to some embodiments of the present disclosure will be described with reference to FIGS. 1 to 6.

Figure 2:
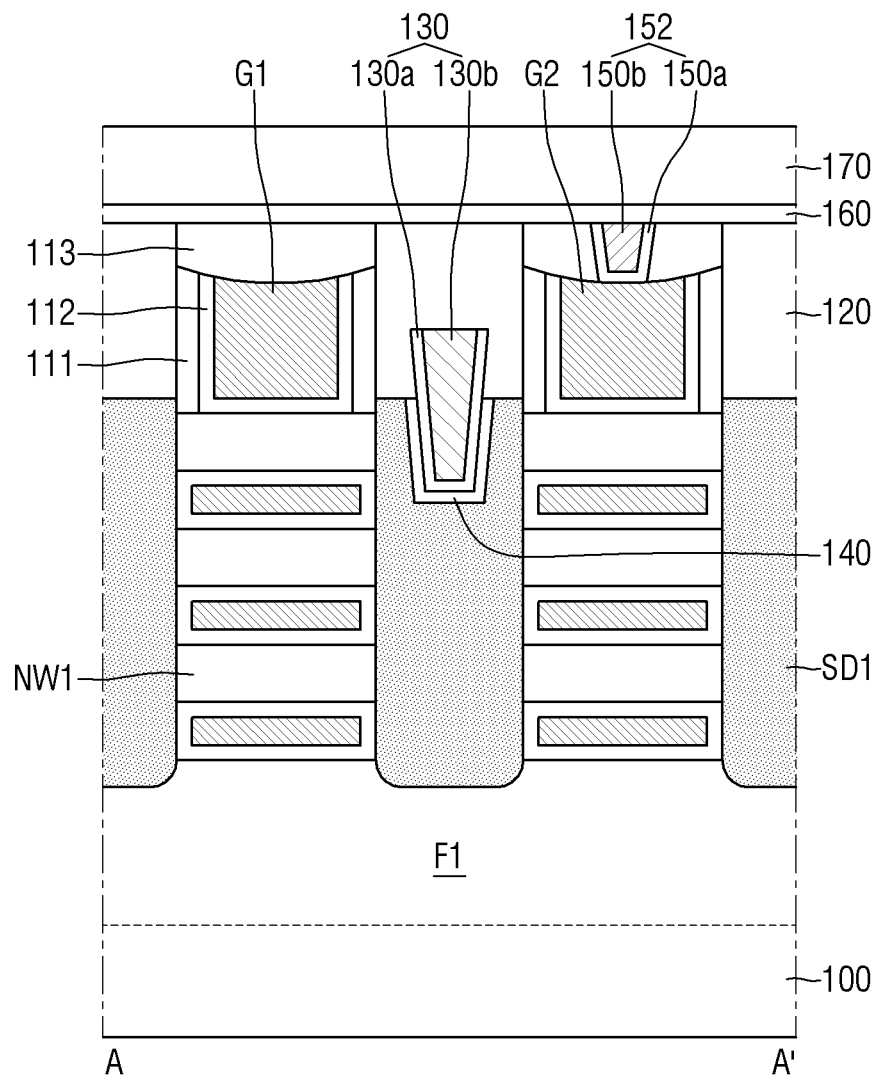
FIG. 2 is a cross-sectional view taken along a line A-A' of FIG. 1.
Figure 3:
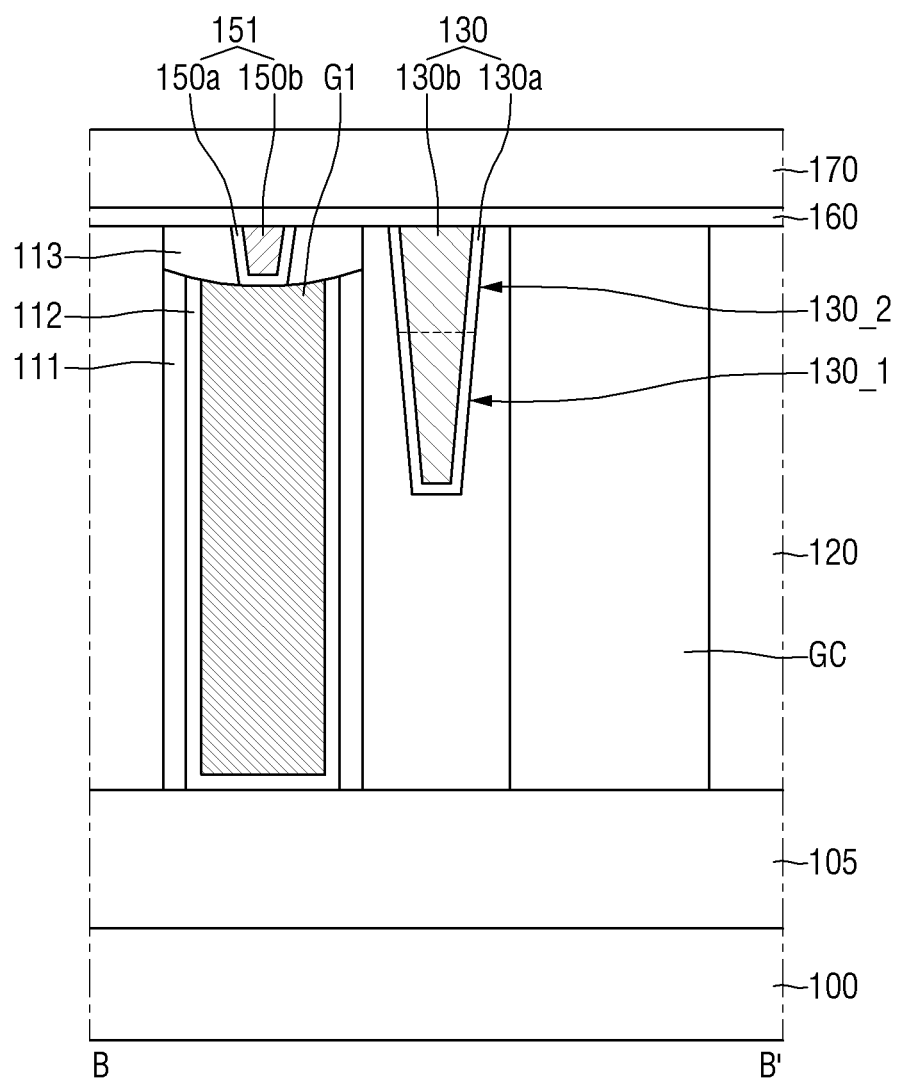
FIG. 3 is a cross-sectional view taken along a line B-B' of FIG. 1.
Figure 3:
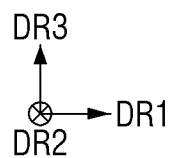
Figure 4:
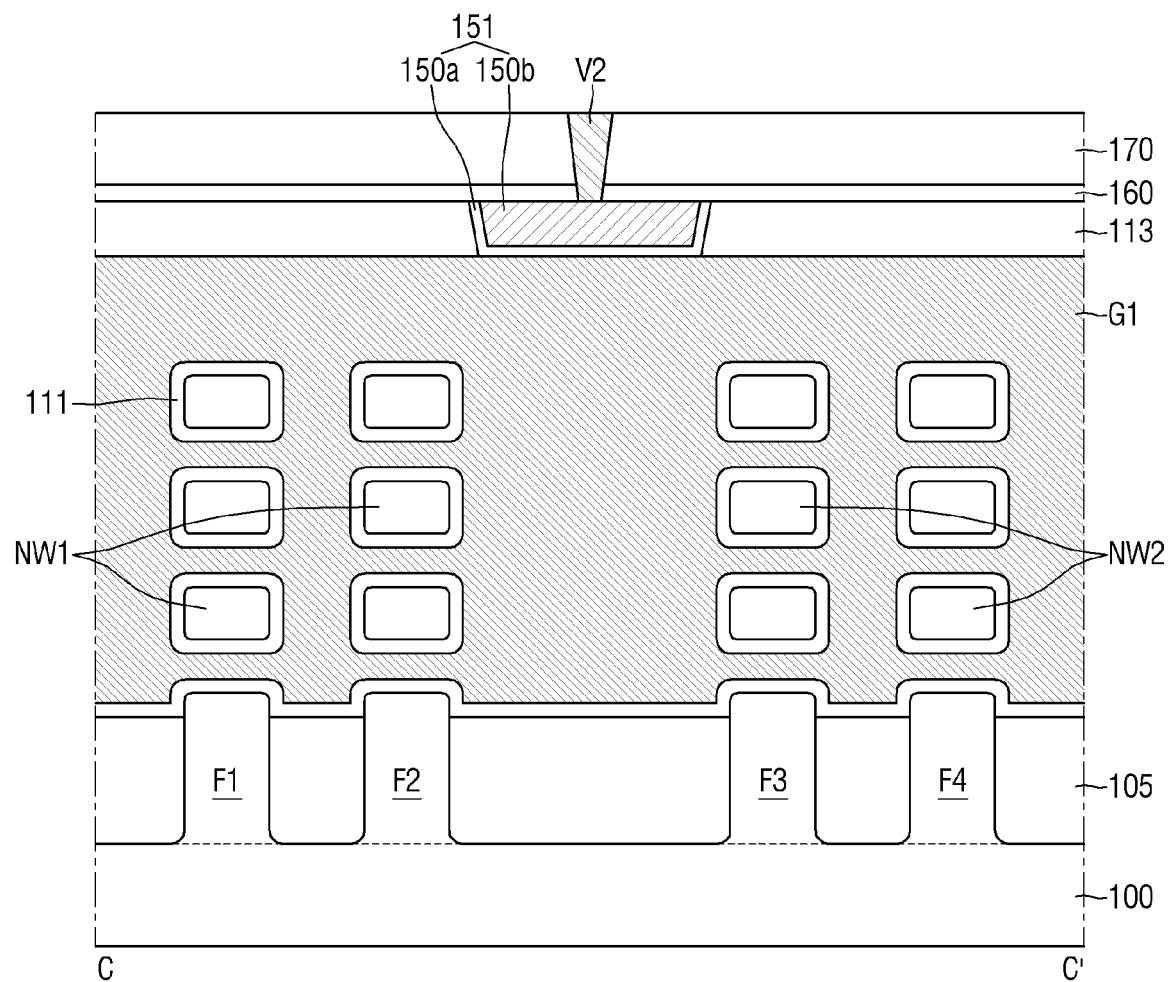
FIG. 4 is a cross-sectional view taken along a line C-C' of FIG. 1.
Figure 4:
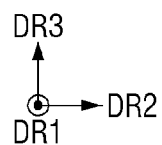
Figure 5:
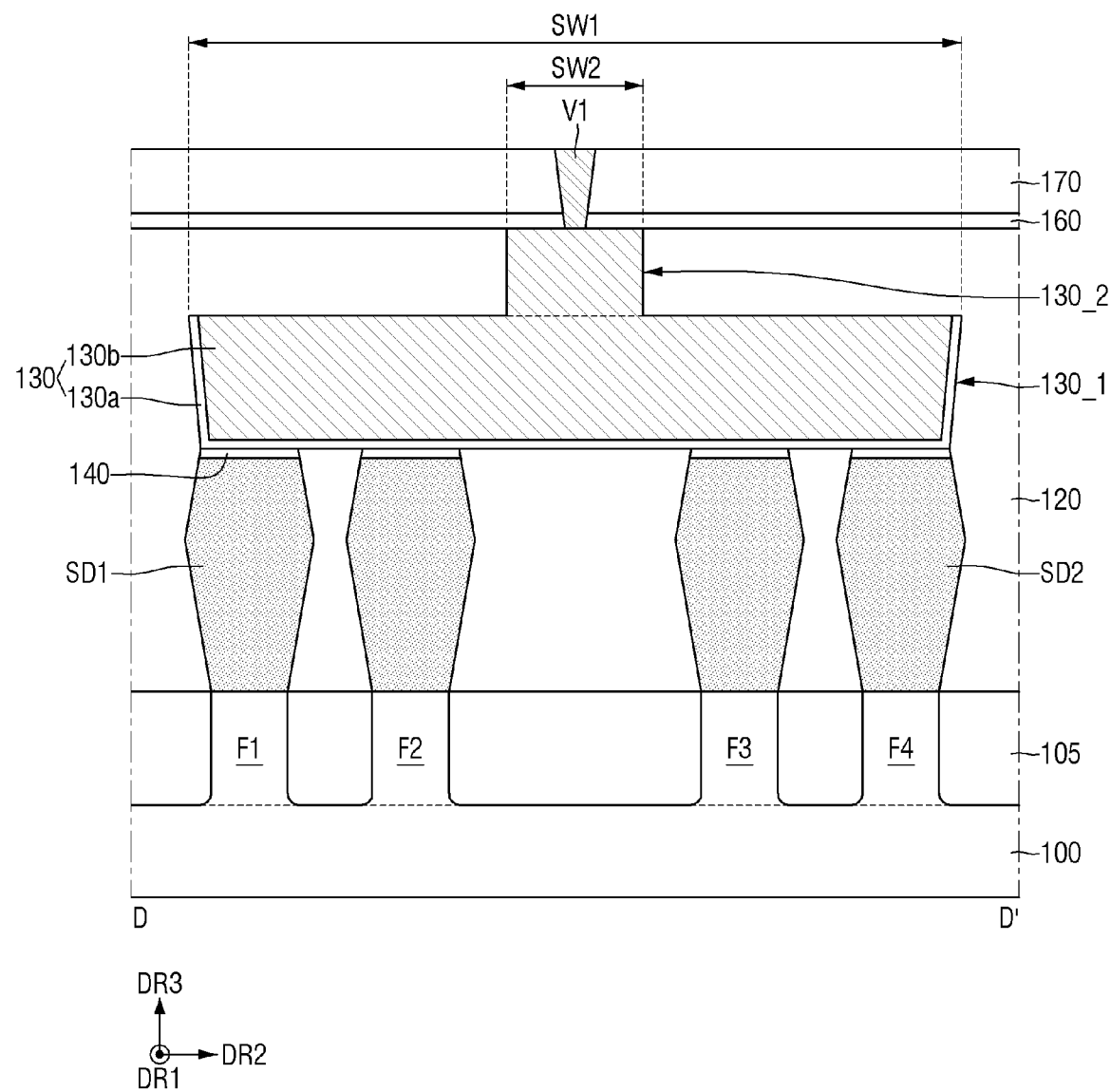
FIG. 5 is a cross-sectional view taken along a line D-D' of FIG. 1.
Figure 6:
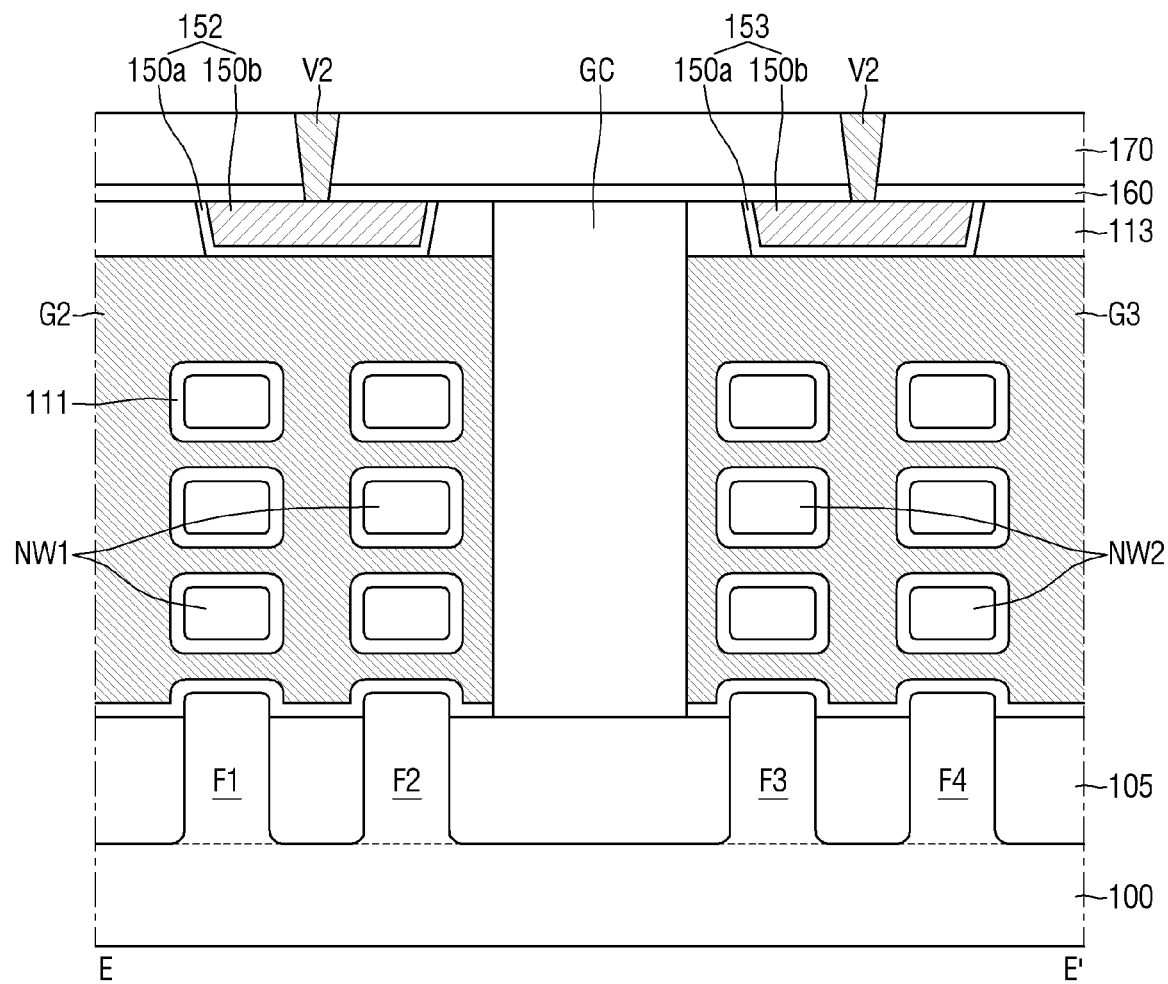
FIG. 6 is a cross-sectional view taken along a line E-E' of FIG. 1.

FIG. 1 is a layout diagram for explaining a semiconductor device according to some embodiments of the present inventive concepts. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1. FIG. 5 is a cross-sectional view taken along the line D-D' of FIG. 1. FIG. 6 is a cross-sectional view taken along the line E-E' of FIG. 1.

Referring to FIGS. 1 to 6, the semiconductor device according to some embodiments of the present disclosure includes a substrate 100, first to fourth active patterns F1, F2, F3, and F4, a field insulating layer 105, first and second plurality of nanosheets NW1 and NW2, first to third gate electrodes G1, G2, and G3, a gate spacer 111, a gate insulating layer 112, a capping pattern 113, a gate cut GC, first and second source/drain regions SD1 and SD2, a first interlayer insulating layer 120, a source/drain contact 130, a silicide layer 140, first to third gate contacts 151, 152 and 153, an etching stop layer 160, a second interlayer insulating layer 170, a first via V1, and a second via V2.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenide, indium phosphide, gallium arsenide and/or gallium antimonide.

Each of the first to fourth active patterns F1, F2, F3, and F4 may protrude from the substrate 100 in a vertical direction DR3. The first to fourth active patterns F1, F2, F3, and F4 may each extend in a first horizontal direction DR1. A second active pattern F2 may be spaced apart from the first active pattern F1 in a second horizontal direction DR2 different from the first horizontal direction DR1. A third active pattern F3 may be spaced apart from the second active pattern F2 in the second horizontal direction DR2. A fourth active pattern F4 may be spaced apart from the third active pattern F3 in the second horizontal direction DR2. Here, the vertical direction DR3 may be defined as a direction perpendicular to each of the first horizontal direction DR1 and the second horizontal direction DR2.

A first pitch P1 or distance in the second horizontal direction DR2 between the first active pattern F1 and the second active pattern F2 may be smaller than a second pitch P2 or distance in the second horizontal direction DR2 between the second active pattern F2 and the third active pattern F3. Further, a third pitch P3 or distance in the second horizontal direction DR2 between the third active pattern F3 and the fourth active pattern F4 may be smaller than the second pitch P2 or distance in the second horizontal direction DR2 between the second active pattern F2 and the third active pattern F3. For example, the first pitch P1 or distance in the second horizontal direction DR2 between the first active pattern F1 and the second active pattern F2 may be equal to the third pitch P3 or distance in the second horizontal direction DR2 between the third active pattern F3 and the fourth active pattern F4.

Each of the first to fourth active patterns F1, F2, F3, and F4 may be a part of the substrate 100, or may include an epitaxial layer that is grown from the substrate 100. Each of the first to fourth active patterns F1, F2, F3, and F4 may include, for example, silicon or germanium, which is an elemental semiconductor material. Further, each of the first to fourth active patterns F1, F2, F3, and F4 may include a compound semiconductor, and may include, for example, a group Iv-Iv compound semiconductor or a group III-V compound semiconductor.

The group IV-IV compound semiconductor may include, for example, a binary compound or a ternary compound including at least two or more of carbon (C), silicon (Si), germanium (Ge) and/or tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and/or antimony (Sb) as a group V element.

The field insulating layer 105 may be disposed on the substrate 100. The field insulating layer 105 may contact or surround, in the direction D3, the side walls of each of the first to fourth active patterns F1, F2, F3, and F4. Each of the first to fourth active patterns F1, F2, F3, and F4 may protrude in the vertical direction DR3 from the upper surface of the field insulating layer 105. The field insulating layer 105 may include, for example, an oxide film, a nitride film, an oxynitride film or a combination film thereof.

A first plurality of nanosheets NW1 may be disposed on each of the first and second active patterns F1 and F2. The first plurality of nanosheets NW1 may include a plurality of nanosheets stacked apart from each other in the vertical direction DR3. The first plurality of nanosheets NW1 may be disposed in a portion in which each of the first and second active patterns F1 and F2 intersects each of the first and second gate electrodes G1 and G2.

The first plurality of nanosheets NW1 may be spaced apart from each other in the first horizontal direction DR1 or the second horizontal direction DR2. For example, the first plurality of nanosheets NW1 disposed in the portion in which the first active pattern F1 and the first gate electrode G1 intersect may be spaced apart from the first plurality of nanosheets NW1 disposed in the portion in which the first active pattern F1 and the second gate electrode G2 intersect, in the first horizontal direction DR1. Further, the first plurality of nanosheets NW1 disposed in the portion in which the first active pattern F1 and the first gate electrode G1 intersect may be spaced apart from the first plurality of nanosheets NW1 disposed in the portion in which the second active pattern F2 and the first gate electrode G1 intersect, in the second horizontal direction DR2.

The second plurality of nanosheets NW2 may be disposed on each of the third and fourth active patterns F3 and F4. The second plurality of nanosheets NW2 may include a plurality of nanosheets stacked apart from each other in the vertical direction DR3. The second plurality of nanosheets NW2 may be disposed in a portion in which each of the third and fourth active patterns F3 and F4 intersects each of the first and third gate electrodes G1 and G3.

The second plurality of nanosheets NW2 may be spaced apart from each other in the first horizontal direction DR1 or the second horizontal direction DR2. For example, the second plurality of nanosheets NW2 disposed in the portion in which the third active pattern F3 and the first gate electrode G1 intersect may be spaced apart from the second plurality of nanosheets NW2 disposed in the portion in which the third active pattern F3 and the third gate electrode G3 intersect, in the first horizontal direction DR1. Further, the second plurality of nanosheets NW2 disposed in the portion in which the third active pattern F3 and the first gate electrode G1 intersect may be spaced apart from the second plurality of nanosheets NW2 disposed in the portion in which the fourth active pattern F4 and the first gate electrode G1 intersect, in the second horizontal direction DR2.

Although FIGS. 4 and 6 show that the first and second plurality of nanosheets NW1 and NW2 each include three nanosheets stacked apart from each other in the vertical direction DR3, this is for convenience of explanation, and the present disclosure is not limited thereto. In some other embodiments, the first and second plurality of nanosheets NW1 and NW2 may each include four or more nanosheets stacked apart from each other in the vertical direction DR3.

The first gate electrode G1 may extend in the second horizontal direction DR2 on the field insulating layer 105, and the first to fourth active patterns F1, F2, F3, and F4. The second gate electrode G2 may extend in the second horizontal direction DR2 on the field insulating layer 105, and the first and second active patterns F1 and F2. The second gate electrode G2 may be spaced apart from the first gate electrode G1 in the first horizontal direction DR1. The third gate electrode G3 may extend in the second horizontal direction DR2 on the field insulating layer 105, and the third and fourth active patterns F3 and F4. The third gate electrode G3 may be spaced apart from the first gate electrode G1 in the first horizontal direction DR1. The third gate electrode G3 may be spaced apart from the second gate electrode G2 in the second horizontal direction DR2.

Each of the first to third gate electrodes G1, G2, and G3 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or combinations thereof. Each of the first to third gate electrodes G1, G2, and G3 may include a conductive metal oxide, a conductive metal oxynitride, and/or the like, and/or may also include an oxidized form of the above-mentioned materials.

The gate spacer 111 may extend in the second horizontal direction DR2 along the side walls of each of the first to third gate electrodes G1, G2, and G3 on the field insulating layer 105. The gate spacer 111 may extend in the second horizontal direction DR2 along the side walls of each of the first to third gate electrodes G1, G2, and G3 on the uppermost nanosheets of each of the first and second plurality of nanosheets NW1 and NW2.

The gate insulating layer 112 may be disposed between each of the first and third gate electrodes G1, G2, and G3 and each of the first and second plurality of nanosheets NW1 and NW2. The gate insulating layer 112 may be disposed between each of the first to third gate electrodes G1, G2, and G3 and the gate spacer 111. The gate insulating layer 112 may be disposed between each of the first and third gate electrodes G1, G2, and G3 and each of the first and second source/drain regions SD1 and SD2. The gate insulating layer 112 may be disposed between each of the first to third gate electrodes G1, G2, and G3 and each of the first to fourth active patterns F1, F2, F3, and F4. The gate insulating layer 112 may be disposed between each of the first to third gate electrodes G1, G2, and G3 and the field insulating layer 105.

The gate insulating layer 112 may include silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include an NC (Negative Capacitance) FET that uses a negative capacitor. For example, the gate insulating layer 112 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) of 60 mV/decade or less at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and/or a metal oxide having a high dielectric constant. The metal oxide included in the paraelectric material film may include, for example, but is not limited to, at least one of hafnium oxide, zirconium oxide, and/or aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the gate insulating layer 112 may include one ferroelectric material film. As another example, the gate insulating layer 112 may include a plurality of ferroelectric material films spaced apart from each other. The gate insulating layer 112 may have a stacked film structure in which a plurality of ferroelectric material films and a plurality of paraelectric material films are alternately stacked.

The capping pattern 113 may be disposed on each of the first to third gate electrodes G1, G2, and G3. For example, an upper surface of the capping pattern 113 may be disposed on the same plane as an upper surface of the first interlayer insulating layer 120. The capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and/or a combination thereof.

The gate cut GC may be disposed between the second gate electrode G2 and the third gate electrode G3. For example, the gate cut GC may extend in the vertical direction DR3 from the upper surface of the field insulating layer 105 to the upper surface of the first interlayer insulating layer 120. However, the present disclosure is not limited thereto. In some other embodiments, at least a part of the gate cut GC may be disposed inside the field insulating layer 105. The gate cut GC may include, for example, at least one of silicon nitride (SiN), silicon oxynitride (SiON), silicon oxide (SiO$_2$), silicon carbonitride (SiCN), silicon oxycarbonitride (SiOCN), silicon boronitride (SiBN), silicon oxyboronitride (SiOBN), silicon oxycarbide (SiOC), and/or combinations thereof.

A first source/drain region SD1 may be disposed on each of the first and second active patterns F1 and F2 on at least one side of each of the first and second gate electrodes G1 and G2. For example, the first source/drain region SD1 may be disposed on each of the first and second active patterns F1 and F2 between the first gate electrode G1 and the second gate electrode G2. A second source/drain region SD2 may be disposed on each of the third and fourth active patterns F3 and F4 on at least one side of each of the first and third gate electrodes G1 and G3. For example, the second source/drain region SD2 may be disposed on each of the third and fourth active patterns F3 and F4 between the first gate electrode G1 and the third gate electrode G3.

Each of the first and second source/drain regions SD1 and SD2 may be in contact with each of the first and second plurality of nanosheets NW1 and NW2. Although FIG. 2 shows that the upper surfaces of each of the first and second source/drain regions SD1 and SD2 are formed to be higher than the upper surfaces of the uppermost nanosheets of each of the first and second plurality of nanosheets NW1 and NW2, the present disclosure is not limited thereto.

For example, although FIG. 5 shows that the first source/drain region SD1 disposed on the first active pattern F1 and the first source/drain region SD1 disposed on the second active pattern F2 are disposed apart from each other, the present disclosure is not limited thereto. In some other embodiments, the first source/drain region SD1 disposed on the first active pattern F1 and the first source/drain region SD1 disposed on the second active pattern F2 may have a merged shape.

The first interlayer insulating layer 120 may be disposed on the field insulating layer 105. The first interlayer insulating layer 120 may surround the side walls of each of the first and second source/drain regions SD1 and SD2. The first interlayer insulating layer 120 may surround the side walls of each of the first to third gate electrodes G1, G2, and G3. For example, the upper surface of the first interlayer insulating layer 120 may be formed on the same plane as the upper surface of the capping pattern 113. However, the present disclosure is not limited thereto.

The first interlayer insulating layer 120 may include, for example, at least one of silicon oxide, silicon nitride, silicon oxycarbide, silicon oxynitride, silicon oxycarbonitride, and/or a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

The source/drain contact 130 may be disposed on each of the first and second source/drain regions SD1 and SD2. The source/drain contact 130 may penetrate through the first interlayer insulating layer 120 in the vertical direction DR3, and extend to each of the first and second source/drain regions SD1 and SD2. The source/drain contact 130 may be directly electrically connected to each of the first and second source/drain regions SD1 and SD2.

For example, the source/drain contact 130 may be disposed between the first gate electrode G1 and the second gate electrode G2, and between the first gate electrode G1 and the third gate electrode G3. The source/drain contact 130 may extend in the second horizontal direction DR2. For example, the upper surface of the source/drain contact 130 may be formed on the same plane as the upper surface of the first interlayer insulating layer 120.

The source/drain contact 130 may include a first portion 130_1, and a second portion 130_1 protruding from the first portion 130_1 in the vertical direction DR3. The first portion 130_1 of the source/drain contact 130 may be connected to each of the first and second source/drain regions SD1 and SD2. The upper surface of the first portion 130_1 of the source/drain contact 130 may be in contact with the first interlayer insulating layer 120. The second portion 130_2 of the source/drain contact 130 may protrude from the upper surface of the first portion 130_1 of the source/drain contact 130 in the vertical direction DR3.

The side walls of the second portion 130_2 of the source/drain contact 130 may be in contact with the first interlayer insulating layer 120. For example, the upper surface of the second portion 130_2 of the source/drain contact 130 may be formed on the same plane as the upper surface of the first interlayer insulating layer 120. For example, the second portion 130_2 of the source/drain contact 130 may be disposed on the field insulating layer 105 between the second active pattern F2 and the third active pattern F3. A width SW2 in the second horizontal direction DR2 of the second portion 130_2 of the source/drain contact 130 may be smaller than a width SW1 in the second horizontal direction DR2 of the first portion 130_1 of the source/drain contact 130.

In some other embodiments, the side walls in the second horizontal direction DR2 of the first portion 130_1 of the source/drain contact 130 may have a slope profile that is continuous with the side walls in the second horizontal DR2 of the second portion 130_2 of the source/drain contact 130.

The source/drain contact 130 may include a first contact barrier layer 130a and a first contact filling layer 130b. The first contact barrier layer 130a may form side walls and a bottom surface of the first portion 130_1 of the source/drain contact 130. The first contact barrier layer 130a may be disposed on both side walls in the first horizontal direction DR1 of the second portion 130_2 of the source/drain contact 130. The first contact barrier layer 130a may not be disposed on both side walls in the second horizontal direction DR2 of the second portion 130_2 of the source/drain contact 130.

The first contact barrier layer 130a may include, for example, at least one of tantalum (Ta), tantalum nitride (TaN), titanium (Ti), titanium nitride (TiN), ruthenium (Ru), cobalt (Co), nickel (Ni), nickel boron (Ni), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and/or rhodium (Rh). However, the present disclosure is not limited thereto.

The first contact filling layer 130b may be disposed on the first contact barrier layer 130a. The upper surface of the first contact filling layer 130b of the first portion 130_1 of the source/drain contact 130 may be in contact with the first interlayer insulating layer 120. The side walls of the first contact filling layer 130b of the second portion 130_2 of the source/drain contact 130 may be in contact with the first interlayer insulating layer 120. The first contact filling layer 130b may include, for example, at least one of aluminum (Al), copper (Cu), tungsten (W), cobalt (Co), ruthenium (Ru) and/or molybdenum (Mo). However, the present disclosure is not limited thereto.

A silicide layer 140 may be disposed between the first source/drain region SD1 and the source/drain contact 130, and between the second source/drain region SD2 and the source/drain contact 130. The silicide layer 140 may include, for example, a metal silicide material.

The first gate contact 151 may be disposed on the first gate electrode G1. The first gate contact 151 may be disposed between the second active pattern F2 and the third active pattern F3. The first gate contact 151 may overlap the second portion 130_2 of the source/drain contact 130 in the first horizontal direction DR1. The first gate contact 151 may penetrate the capping pattern 113 in the vertical direction DR3, and extend to the first gate electrode G1. The first gate contact 151 may be directly electrically connected to the first gate electrode G1.

The first gate contact 151 may extend in the second horizontal direction DR2. That is, the width GW1 in the first horizontal direction DR1 of the first gate contact 151 may be smaller than the width GW2 in the second horizontal direction DR2 of the first gate contact 151. The first gate contact 151 may have, for example, a rectangular shape having a long side in the second horizontal direction DR2.

The second gate contact 152 may be disposed on the second gate electrode G2. The second gate contact 152 may overlap at least one of the first and second active patterns F1 and F2 in the vertical direction DR3. The second gate contact 152 may overlap the first portion 130_1 of the source/drain contacts 130 disposed on the first and second active patterns F1 and F2 in the first horizontal direction DR1. The second gate contact 152 may not overlap the second portion 130_2 of the source/drain contact 130. The second gate contact 152 may penetrate the capping pattern 113 in the vertical direction DR3 and extend to the second gate electrode G2. The second gate contact 152 may be directly electrically connected to the second gate electrode G2.

A second gate contact 152 may extend in the second horizontal direction DR2. That is, a width GW3 in the first horizontal direction DR1 of the second gate contact 152 may be smaller than a width GW4 in the second horizontal direction DR2 of the second gate contact 152. The second gate contact 152 may have, for example, a rectangular shape having a long side in the second horizontal direction DR2.

A third gate contact 153 may be disposed on the third gate electrode G3. The third gate contact 153 may overlap at least one of the third and fourth active patterns F3 and F4 in the vertical direction DR3. The third gate contact 153 may overlap the first portion 130_1 of the source/drain contact 130 disposed on the third and fourth active patterns F3 and F4 in the first horizontal direction DR1. The third gate contact 153 may not overlap the second portion 130_2 of the source/drain contact 130. The third gate contact 153 may penetrate the capping pattern 113 in the vertical direction DR3 and extend to the third gate electrode G3. The third gate contact 153 may be directly electrically connected to the third gate electrode G3.

The third gate contact 153 may be spaced apart from the second gate contact 152 in the second horizontal direction DR2. The third gate contact 153 may extend in the second horizontal direction DR2. That is, the width in the first horizontal direction DR1 of the third gate contact 153 may be smaller than the width in the second horizontal direction DR2 of the third gate contact 153. The third gate contact 153 may have, for example, a rectangular shape having a long side in the second horizontal direction DR2.

Each of the first to third gate contacts 151, 152, and 153 may include a second contact barrier layer 150a and a second contact filling layer 150b. The second contact barrier layer 150a may form the side walls and bottom surfaces of each of the first to third gate contacts 151, 152, and 153. The second contact filling layer 150b may be disposed on the second contact barrier layer 150a.

The second contact barrier layer 150a may include, for example, at least one of tantalum (Ta), tantalum nitride (TaN), titanium (Ti), titanium nitride (TiN), ruthenium (Ru), cobalt (Co), nickel (Ni), nickel boron (Ni), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and/or rhodium (Rh). However, the present disclosure is not limited thereto. The second contact filling layer 150b may include, for example, at least one of aluminum (Al), copper (Cu), tungsten (W), cobalt (Co), ruthenium (Ru) and/or molybdenum (Mo). However, the present disclosure is not limited thereto.

The etching stop layer 160 may be disposed on the first interlayer insulating layer 120 and the capping pattern 113. The etching stop layer 160 may cover or overlap a part of the upper surface of the second portion 130_2 of the source/drain contact 130 and the upper surfaces of each of the first to third gate contacts 151, 152, and 153. Although FIGS. 2 to 6 show that the etching stop layer 160 is formed of a single film, the present disclosure is not limited thereto. In some other embodiments, the etching stop layer 160 may be formed of multiple films. The etching stop layer 160 may include, for example, at least one of silicon oxide, silicon nitride, silicon oxynitride, and/or a low dielectric constant material.

The second interlayer insulating layer 170 may be disposed on the etching stop layer 160. The second interlayer insulating layer 170 may include, for example, at least one of silicon oxide, silicon nitride, silicon oxynitride, and/or a low dielectric constant material.

The first via V1 may penetrate the second interlayer insulating layer 170 and the etching stop layer 160 in the vertical direction DR3, and be connected to the second portion 130_2 of the source/drain contact 130. Although FIG. 5 shows that the first via V1 is formed of a single film, this is for convenience of explanation, and the present disclosure is not limited thereto. That is, the first via V1 may be formed of a multiple film. The first via V1 may include a conductive material.

The second via V2 may penetrate the second interlayer insulating layer 170 and the etching stop layer 160 in the vertical direction DR3, and be connected to any one of the first to third gate contacts 151, 152, and 153. Although FIGS. 4 and 6 show that the second via V2 is formed of a single film, this is for convenience of explanation, and the present disclosure is not limited thereto. That is, the second via V2 may be formed of a multiple film. The second via V2 may include a conductive material.

Because the gate contacts 151, 152, and 153 are disposed to extend lengthwise in the second horizontal direction DR2 in which the gate electrodes G1, G2, and G3 extend, the semiconductor device according to some embodiments of the present disclosure may secure a contact area between the gate contacts 151, 152, and 153 and the gate electrodes G1, G2 and G3, and may reduce an occurrence of a short circuit between the gate contacts 151, 152 and 153 and the source/drain contact 130.

Hereinafter, the semiconductor device according to some other embodiments of the present disclosure will be described with reference to FIGS. 7 and 8. Differences from the semiconductor devices shown in FIGS. 1 to 6 will be mainly described.

Figure 7:
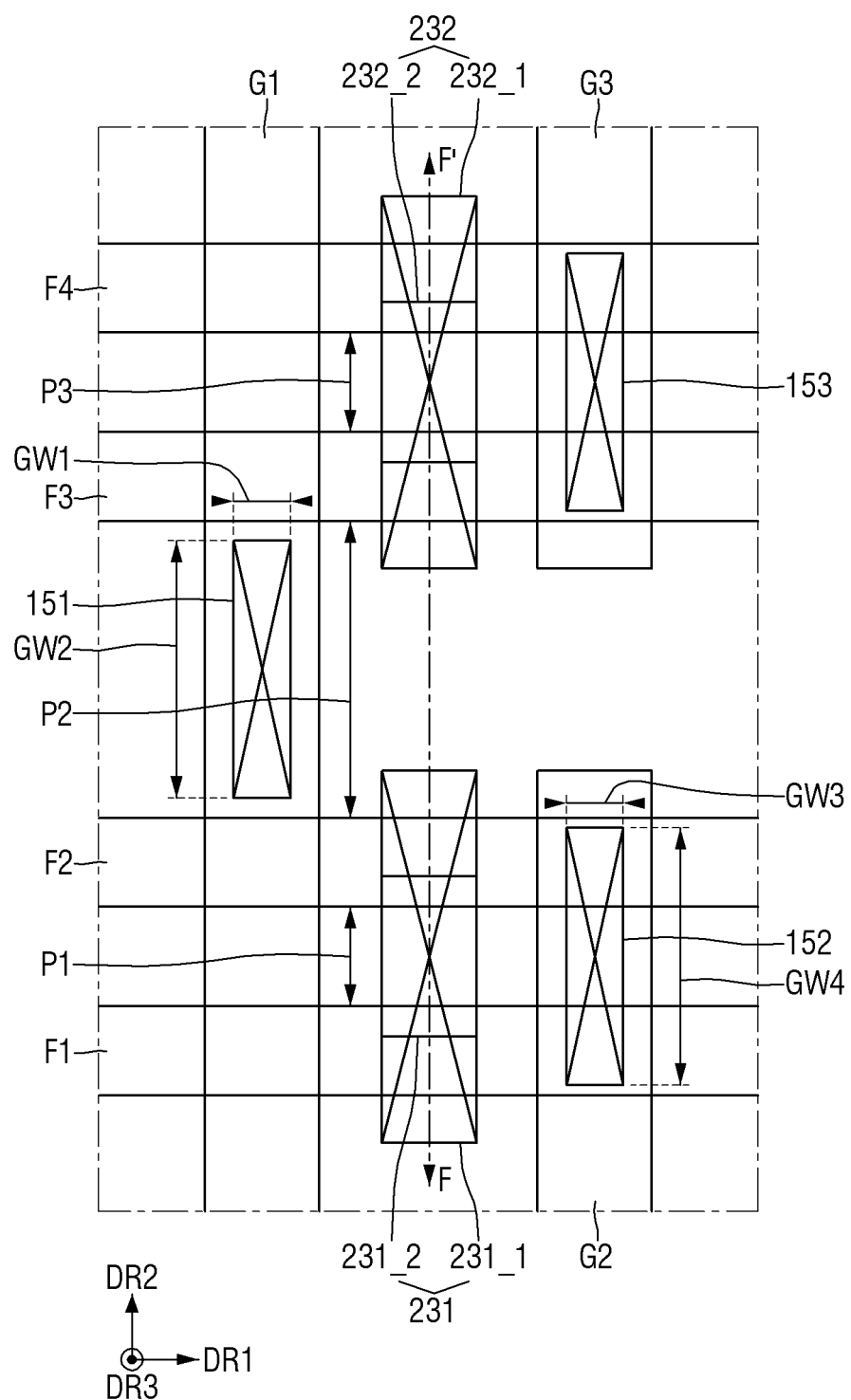
FIG. 7 is a layout drawing for explaining the semiconductor device according to some other embodiments of the present inventive concepts.

FIG. 7 is a layout drawing for explaining the semiconductor device according to some other embodiments of the present inventive concepts. FIG. 8 is a cross-sectional view taken along a line F-F' of FIG. 7.

Figure 8:
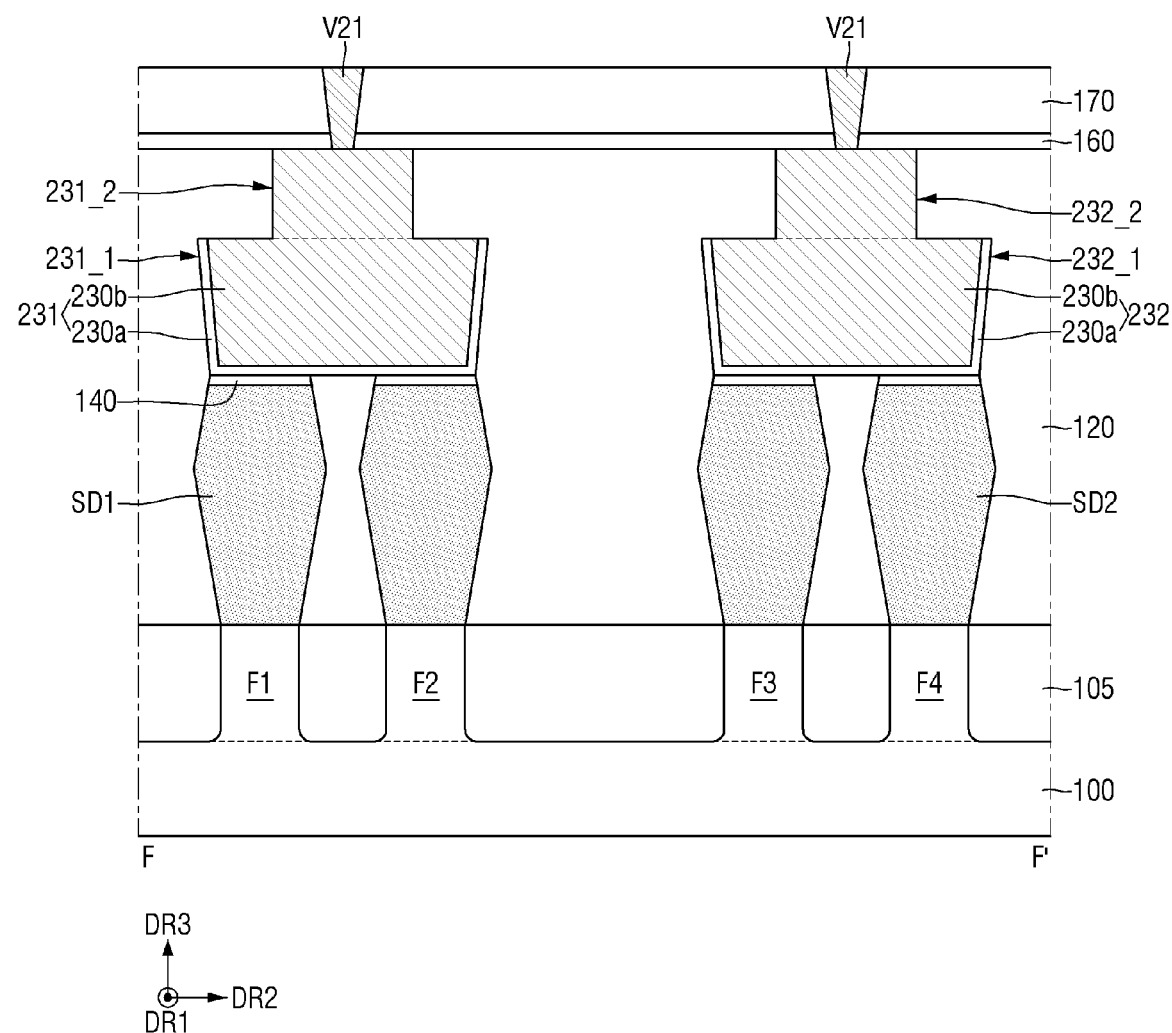
FIG. 8 is a cross-sectional view taken along a line F-F' of FIG. 7.

Referring to FIGS. 7 and 8, the semiconductor device according to some other embodiments of the disclosure may include a first source/drain contact 231 and a second source/drain contact 232 that are spaced apart from each other in the second horizontal direction DR2.

For example, the first source/drain contact 231 may be disposed on the first source/drain region SD1. For example, the first source/drain contact 231 may overlap each of the first and second active patterns F1 and F2 in the vertical direction DR3. The first source/drain contact 231 may include a first portion 231_1, and a second portion 231_2 protruding from the first portion 231_1 in the vertical direction DR3. For example, a width in the second horizontal direction DR2 of the second portion 231_2 of the first source/drain contact 231 may be smaller than a width in the second horizontal direction DR2 of the first portion 231_1 of the first source/drain contact 231.

For example, the second source/drain contact 232 may be disposed on the second source/drain region SD2. For example, the second source/drain contact 232 may overlap each of the third and fourth active patterns F3 and F4 in the vertical direction DR3. The second source/drain contact 232 may be spaced apart from the first source/drain contact 231 in the second horizontal direction DR2. The second source/drain contact 232 may include a first portion 232_1, and a second portion 232_2 protruding from the first portion 232_1 in the vertical direction DR3. For example, the width in the second horizontal direction DR2 of the second portion 232_2 of the second source/drain contact 232 may be smaller than the width in the second horizontal direction DR2 of the first portion 232_1 of the second source/drain contact 232.

Each of the first and second source/drain contacts 231 and 232 may include a first contact barrier layer 230a and a first contact filling layer 230b. The first contact barrier layer 230a may form the side walls and a bottom surface of the first portion 231_1 of the first source/drain contact 231. Further, the first contact barrier layer 230a may form the side walls and a bottom surface of the first portion 232_1 of the second source/drain contact 232.

The first contact barrier layer 230a may be disposed on both side walls in the first horizontal direction DR1 of the second portion 231_2 of the first source/drain contact 231. Further, the first contact barrier layer 230a may be disposed on both side walls in the first horizontal direction DR1 of the second portion 232_2 of the second source/drain contact 232. The first contact barrier layer 230a may not be disposed on both side walls in the second horizontal direction DR2 of the second portion 231_2 of the first source/drain contact 231. Further, the first contact barrier layer 230a may not be disposed on both side walls in the second horizontal direction DR2 of the second portion 232_2 of the second source/drain contact 232.

The first contact filling layer 230b may be disposed on the first contact barrier layer 230a. The upper surface of the first contact filling layer 230b of the first portion 231_1 of the first source/drain contact 231 may be in contact with the first interlayer insulating layer 120. Further, the first contact filling layer 230b may be disposed on the first contact barrier layer 230a. The upper surface of the first contact filling layer 230b of the first portion 231_1 of the first source/drain contact 231 may be in contact with the first interlayer insulating layer 120. Further, the upper surface of the first contact filling layer 230b of the first portion 232_1 of the second source/drain contact 232 may be in contact with the first interlayer insulating layer 120. The side walls of the first contact filling layer 230b of the second portion 231_2 of the first source/drain contact 231 may be in contact with the first interlayer insulating layer 120. Further, the side walls of the first contact filling layer 230b of the second portion 232_2 of the second source/drain contact 232 may be in contact with the first interlayer insulating layer 120.

A first via V21 may penetrate the second interlayer insulating layer 170 and the etching stop layer 160 in the vertical direction DR3, and be connected to any one of the second portion 231_2 of the first source/drain contact 231 and the second portion 232_2 of the second source/drain contact 232.

Hereinafter, a semiconductor device according to some other embodiments of the present inventive concepts will be described with reference to FIGS. 9 and 10. Differences from the semiconductor device shown in FIGS. 1 to 6 will be mainly described.

Figure 9:
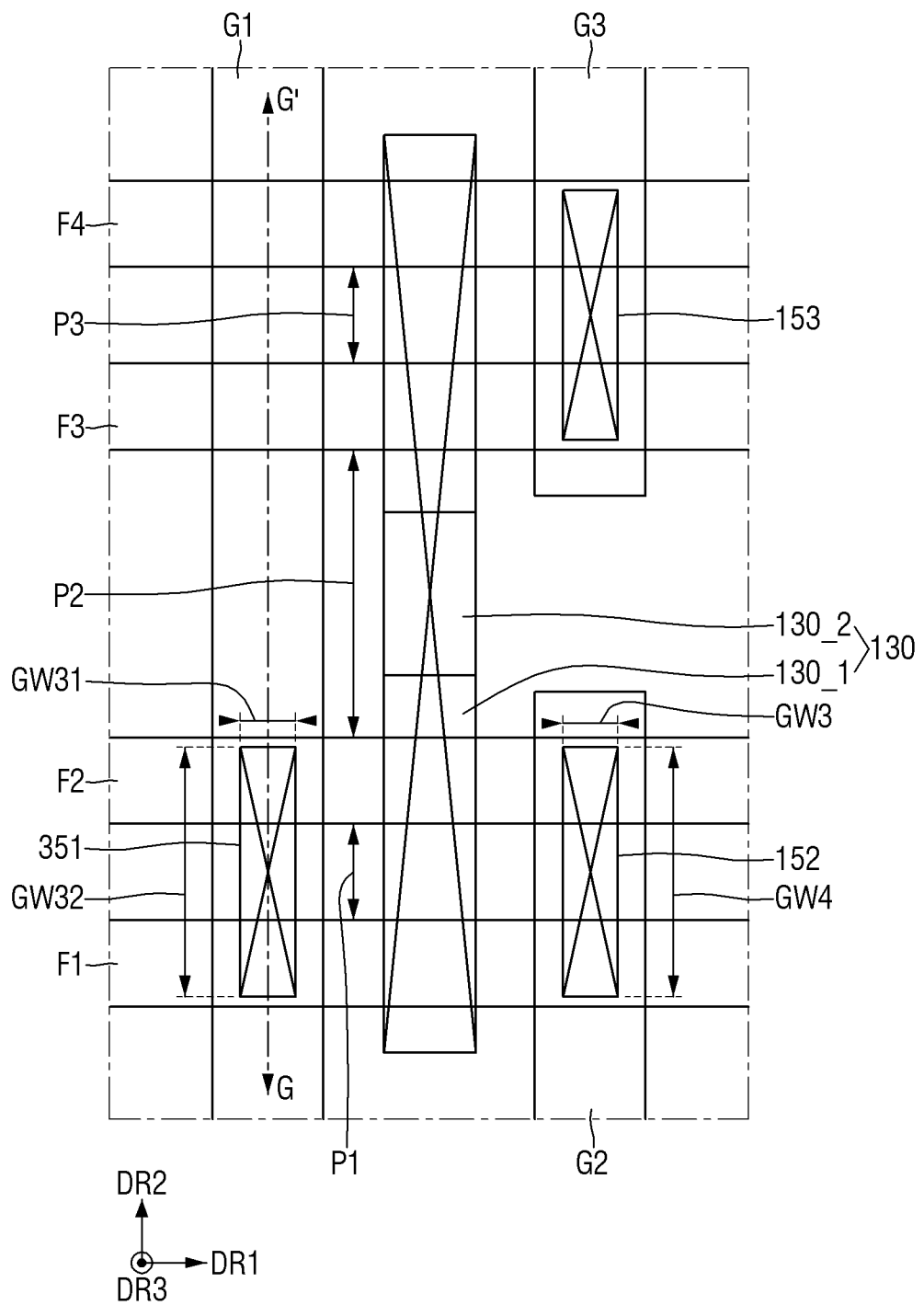
FIG. 9 is a layout diagram for explaining a semiconductor device according to some other embodiments of the present inventive concepts.

FIG. 9 is a layout diagram for explaining a semiconductor device according to some other embodiments of the present inventive concepts. FIG. 10 is a cross-sectional view taken along a line G-G' of FIG. 9.

Figure 10:
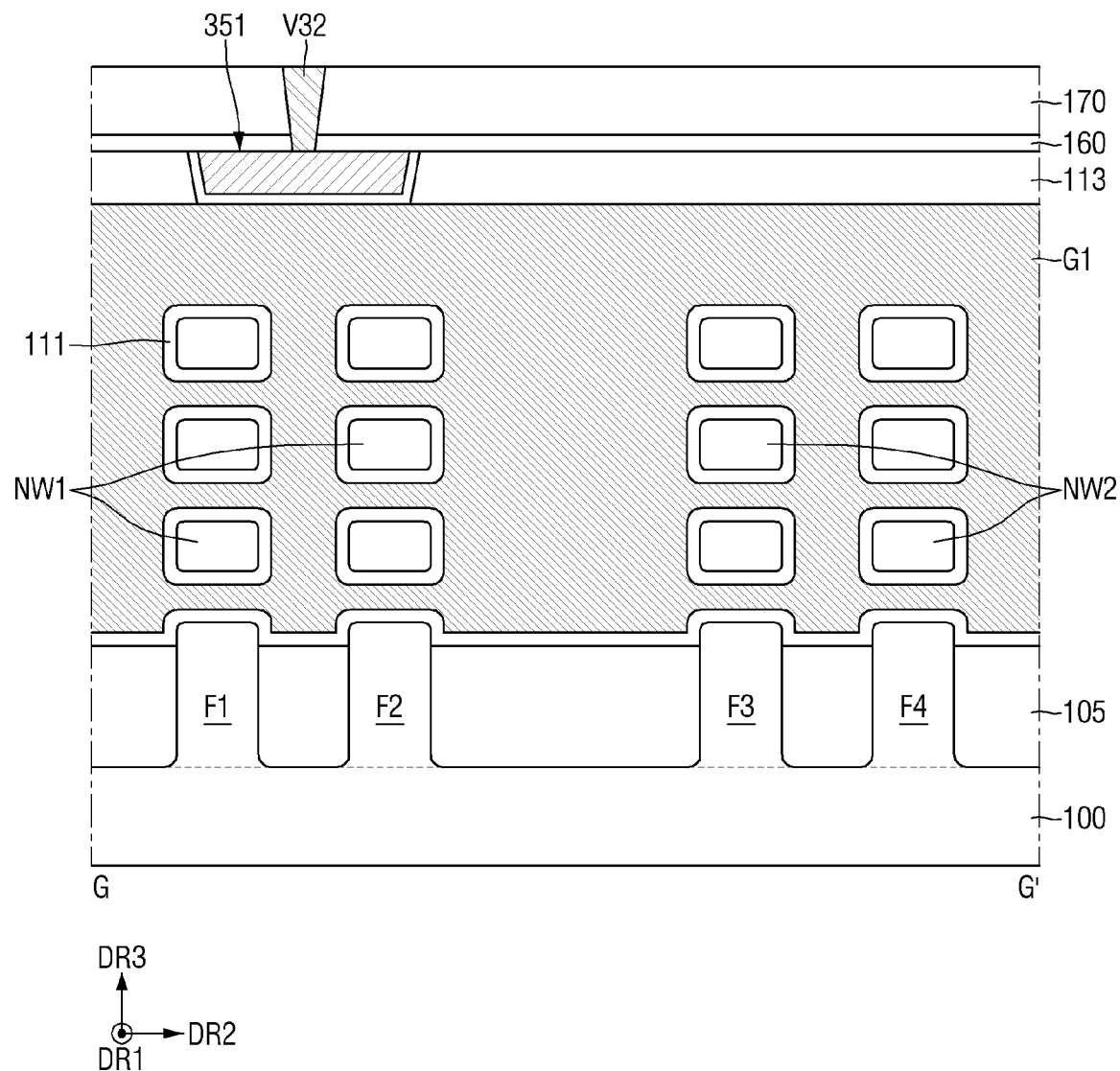
FIG. 10 is a cross-sectional view taken along a line G-G' of FIG. 9.

Referring to FIGS. 9 and 10, in the semiconductor device according to some other embodiments of the present inventive concepts, a first gate contact 351 may overlap each of the first and second active patterns F1 and F2 on the first gate electrode G1 in the vertical direction DR3. The first gate contact 351 may overlap the second gate contact 152 in the first horizontal direction DR1.

The first gate contact 351 may overlap the first portion 130_1 of the source/drain contact 130 disposed on the first and second active patterns F1 and F2 in the first horizontal direction DR1. The first gate contact 351 may extend in the second horizontal direction DR2. That is, a width GW31 in the first horizontal direction DR1 of the first gate contact 351 may be smaller than a width GW32 in the second horizontal direction DR2 of the first gate contact 351.

A second via V32 connected to the first gate contact 351 may penetrate the second interlayer insulating layer 170 and the etching stop layer 160 in the vertical direction DR3, and be connected to the first gate contact 351.

Hereinafter, a semiconductor device according to some other embodiments of the present inventive concepts will be described with reference to FIGS. 11 and 12. Differences from the semiconductor devices shown in FIGS. 1 to 6 will be mainly described.

Figure 11:
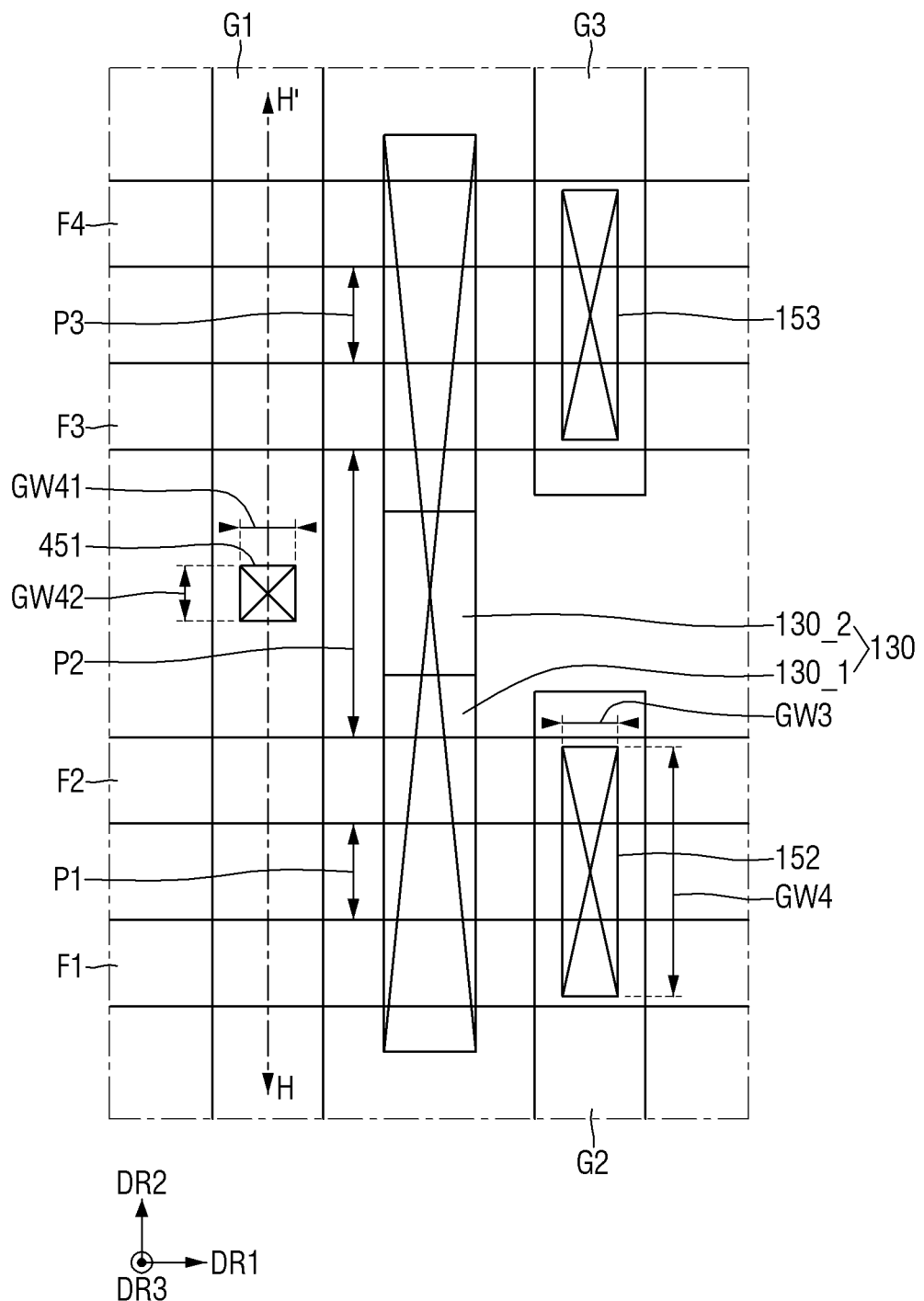
FIG. 11 is a layout diagram for explaining a semiconductor device according to some other embodiments of the present inventive concepts.

FIG. 11 is a layout diagram for explaining a semiconductor device according to some other embodiments of the present inventive concepts. FIG. 12 is a cross-sectional view taken along a line H-H' of FIG. 11.

Figure 12:
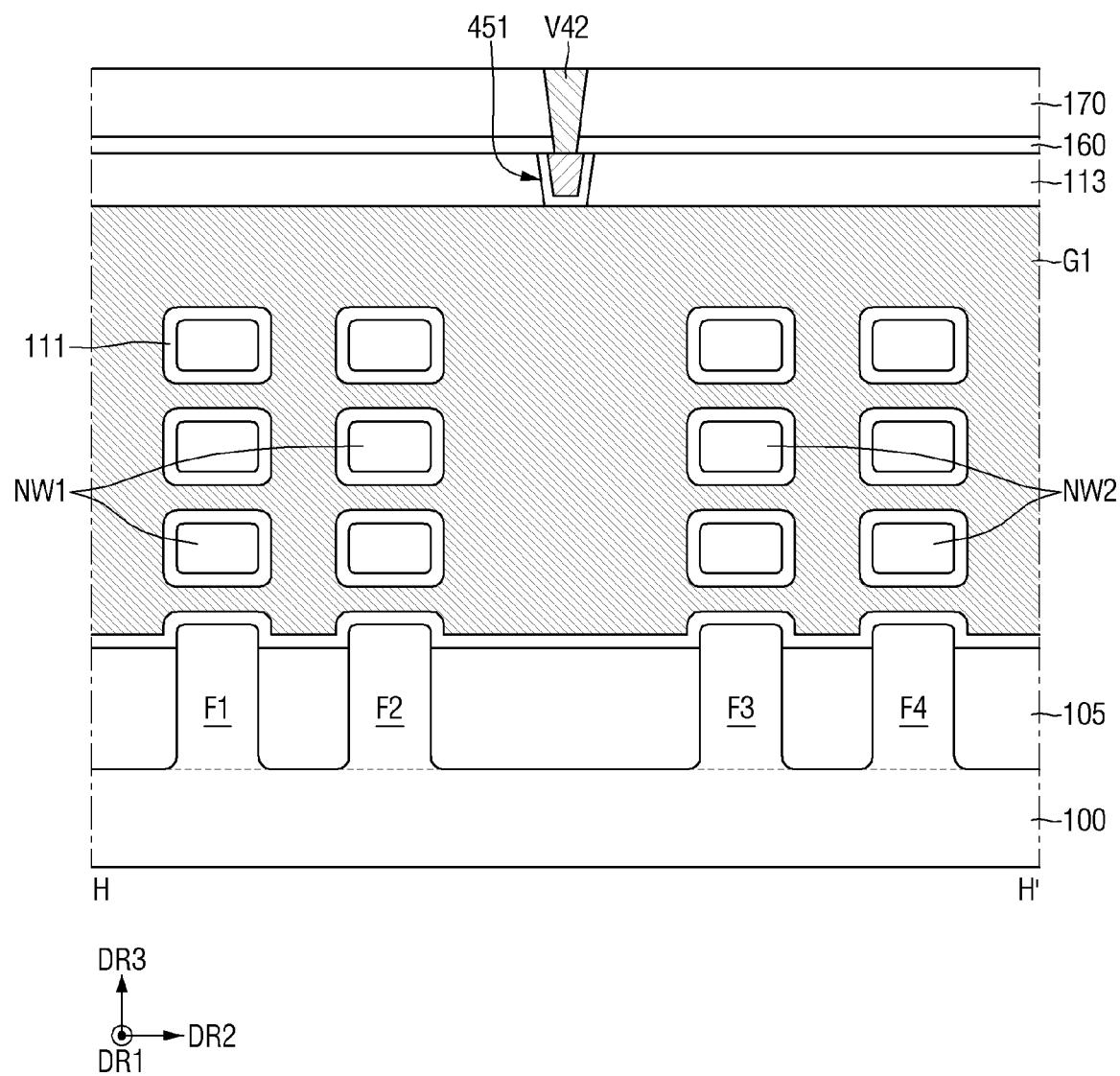
FIG. 12 is a cross-sectional view taken along a line H-H' of FIG. 11.

Referring to FIGS. 11 and 12, in the semiconductor device according to some other embodiments of the present inventive concepts, a width GW41 in the first horizontal direction DR1 of a first gate contact 451 may be the same as a width GW42 in the second horizontal direction DR2 of the first gate contact 451.

That is, the first gate contact 451 may have a square shape in a plane defined by the first horizontal direction DR1 and the second horizontal direction DR2. The first gate contact 451 may be disposed between the second active pattern F2 and the third active pattern F3. A second via V42 connected to the first gate contact 451 may penetrate the second interlayer insulating layer 170 and the etching stop layer 160 in the vertical direction DR3, and be connected to the first gate contact 451.

Hereinafter, a semiconductor device according to some other embodiments of the present inventive concepts will be described with reference to FIGS. 13 and 14. Differences from the semiconductor device shown in FIGS. 1 to 6 will be mainly described.

Figure 13:
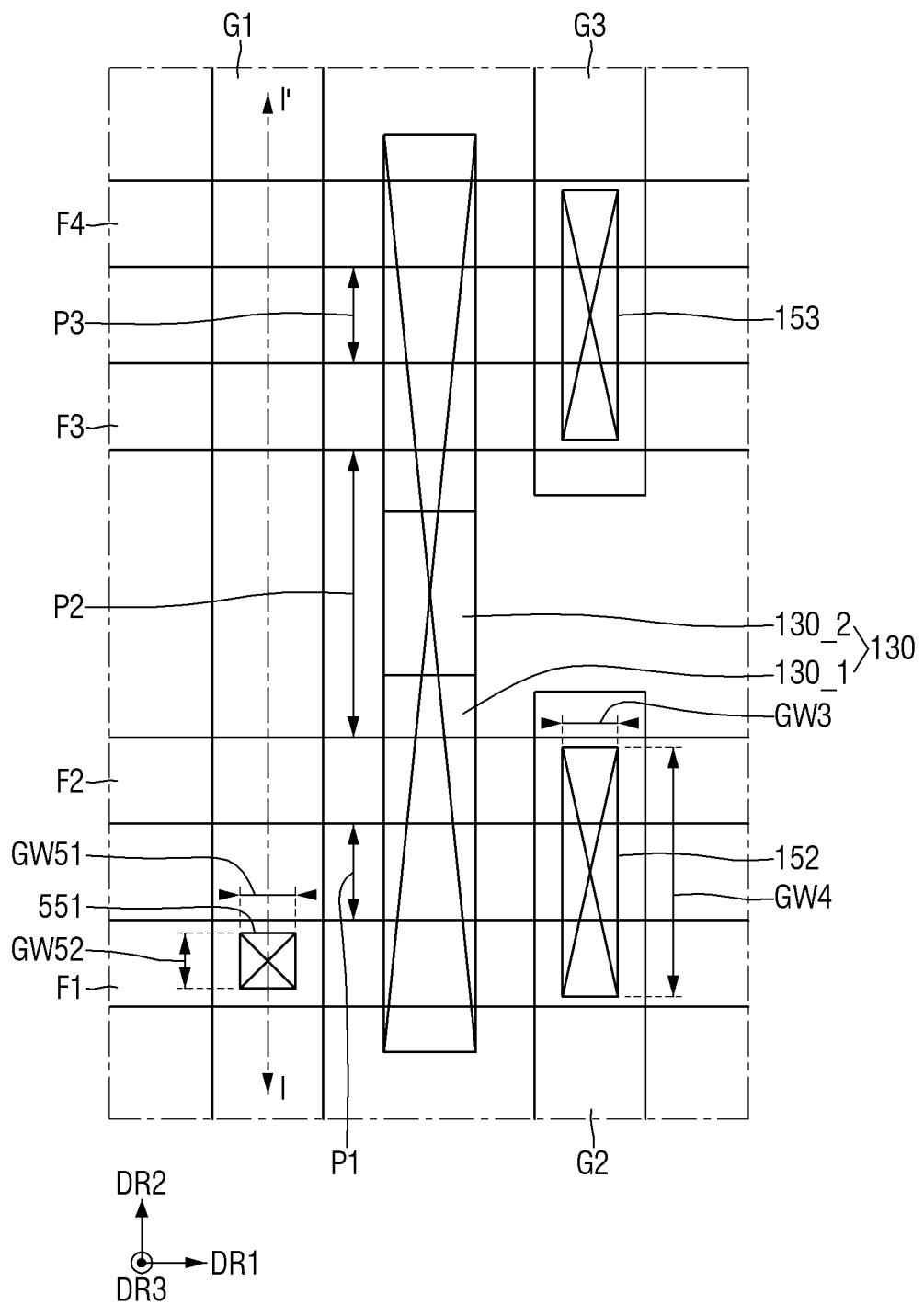
FIG. 13 is a layout diagram for explaining a semiconductor device according to some other embodiments of the present inventive concepts.

FIG. 13 is a layout diagram for explaining a semiconductor device according to some other embodiments of the present inventive concepts. FIG. 14 is a cross-sectional view taken along a line I-I' of FIG. 13.

Figure 14:
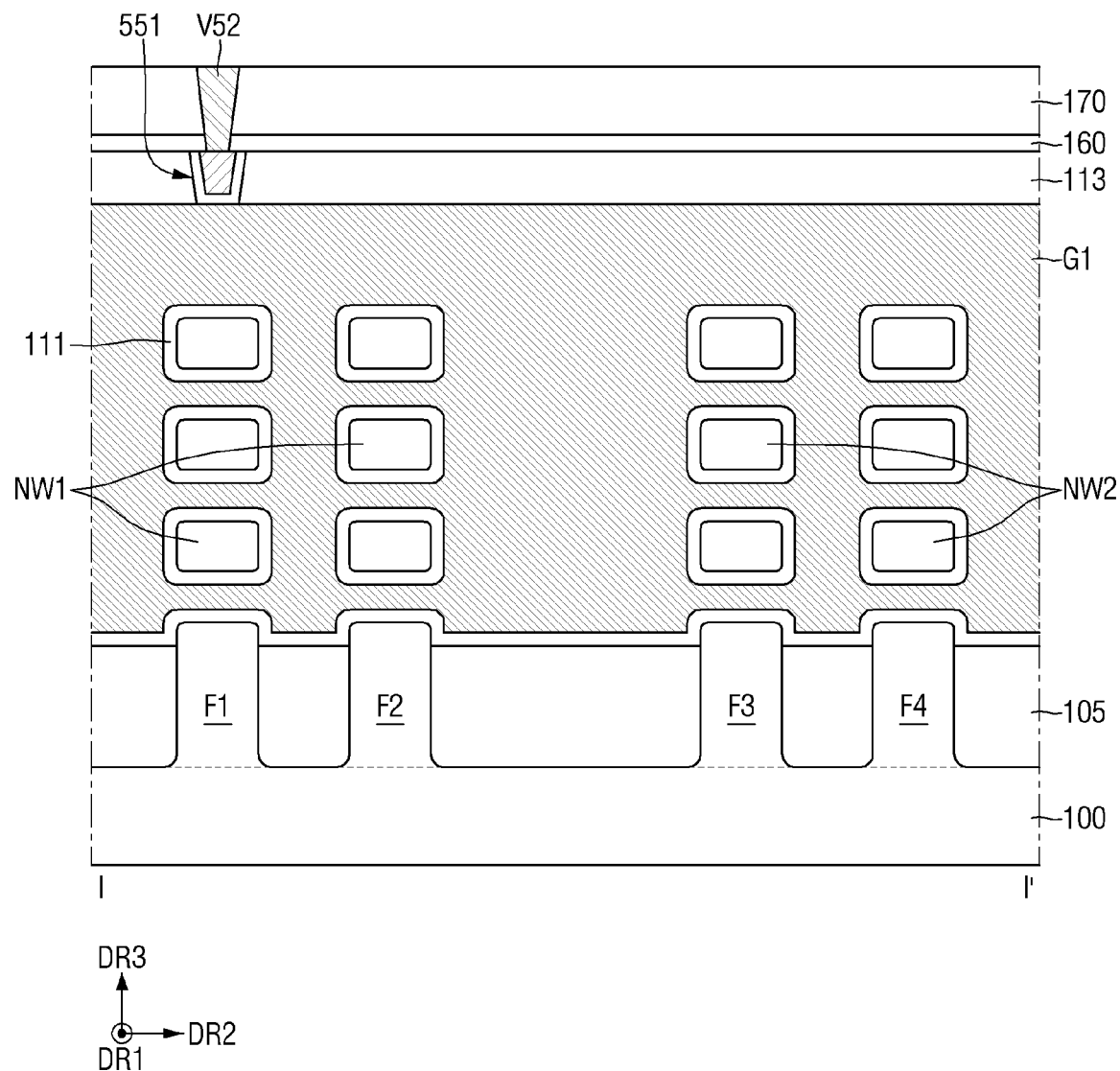
FIG. 14 is a cross-sectional view taken along a line I-I' of FIG. 13.

Referring to FIGS. 13 and 14, in the semiconductor device according to some other embodiments of the present inventive concepts, a first gate contact 551 may overlap the first active pattern F1 on the first gate electrode G1 in the vertical direction DR3. In some other embodiments, the first gate contact 551 may overlap the second active pattern F2 on the first gate electrode G1 in the vertical direction DR3. The first gate contact 551 may overlap the second gate contact 152 in the first horizontal direction DR1.

A width GW51 in the first horizontal direction DR1 of the first gate contact 551 may be equal to a width GW52 in the second horizontal direction DR2 of the first gate contact 551. That is, the first gate contact 551 may have a square shape in the plane defined by the first horizontal direction DR1 and the second horizontal direction DR2. A second via V52 connected to the first gate contact 551 may penetrate the second interlayer insulating layer 170 and the etching stop layer 160 in the vertical direction DR3, and be connected to the first gate contact 551.

Hereinafter, a semiconductor device according to some other embodiments of the present inventive concepts will be described with reference to FIG. 15. Differences from the semiconductor device shown in FIGS. 1 to 6 will be mainly described.

Figure 15:
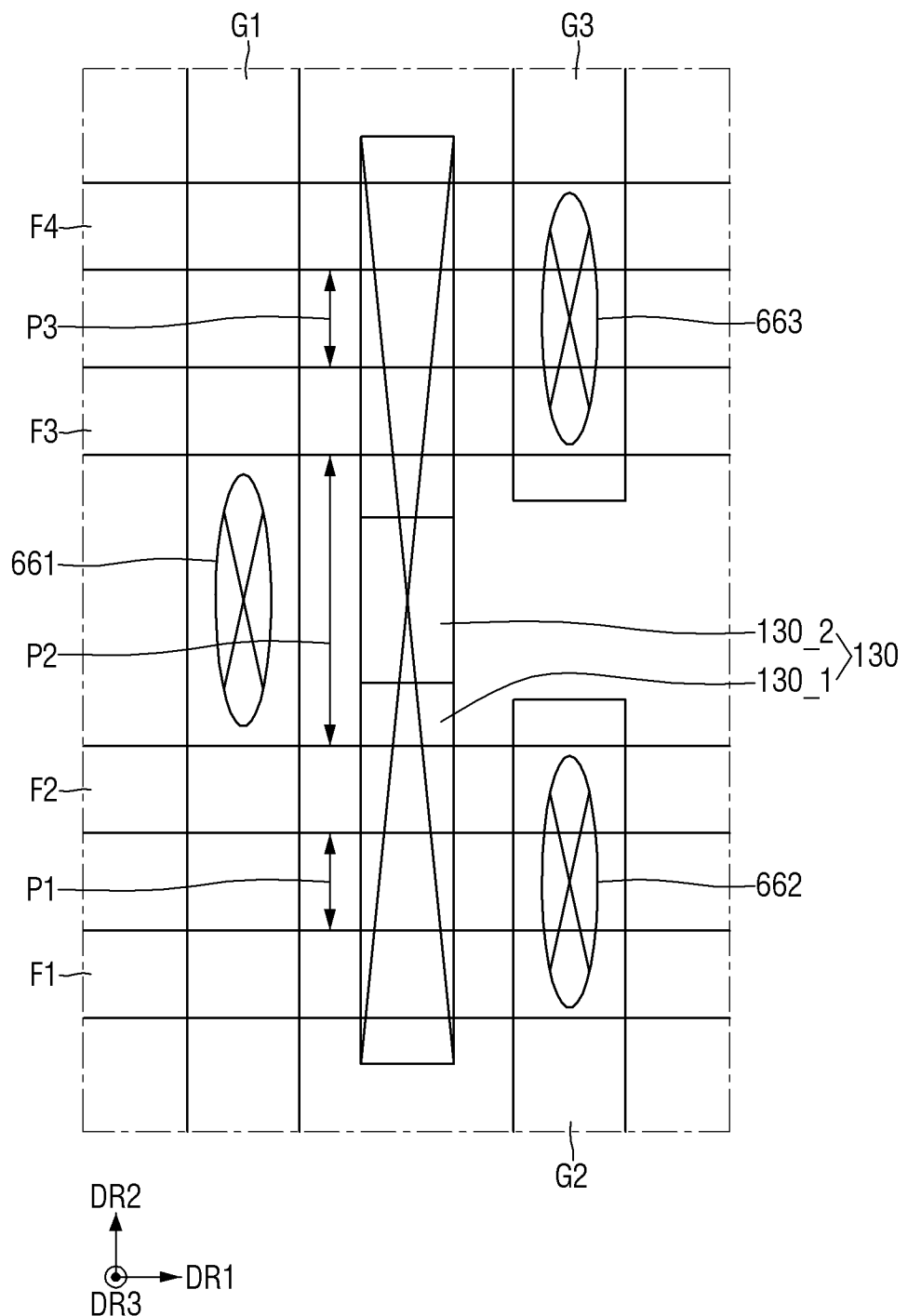
FIG. 15 is a layout diagram for explaining a semiconductor device according to some other embodiments of the present inventive concepts.

FIG. 15 is a layout diagram for explaining a semiconductor device according to some other embodiments of the present inventive concepts.

Referring to FIG. 15, in the semiconductor device according to some other embodiments of the present inventive concepts, each of first to third gate contacts 661, 662, and 663 may have an elliptical shape having a major axis in the second horizontal direction DR2 in the plane defined by the first horizontal direction DR1 and the second horizontal direction DR2.

Hereinafter, a semiconductor device according to some other embodiments of the present inventive concepts will be described with reference to FIG. 16. Differences from the semiconductor device shown in FIGS. 1 to 6 will be mainly described.

Figure 16:
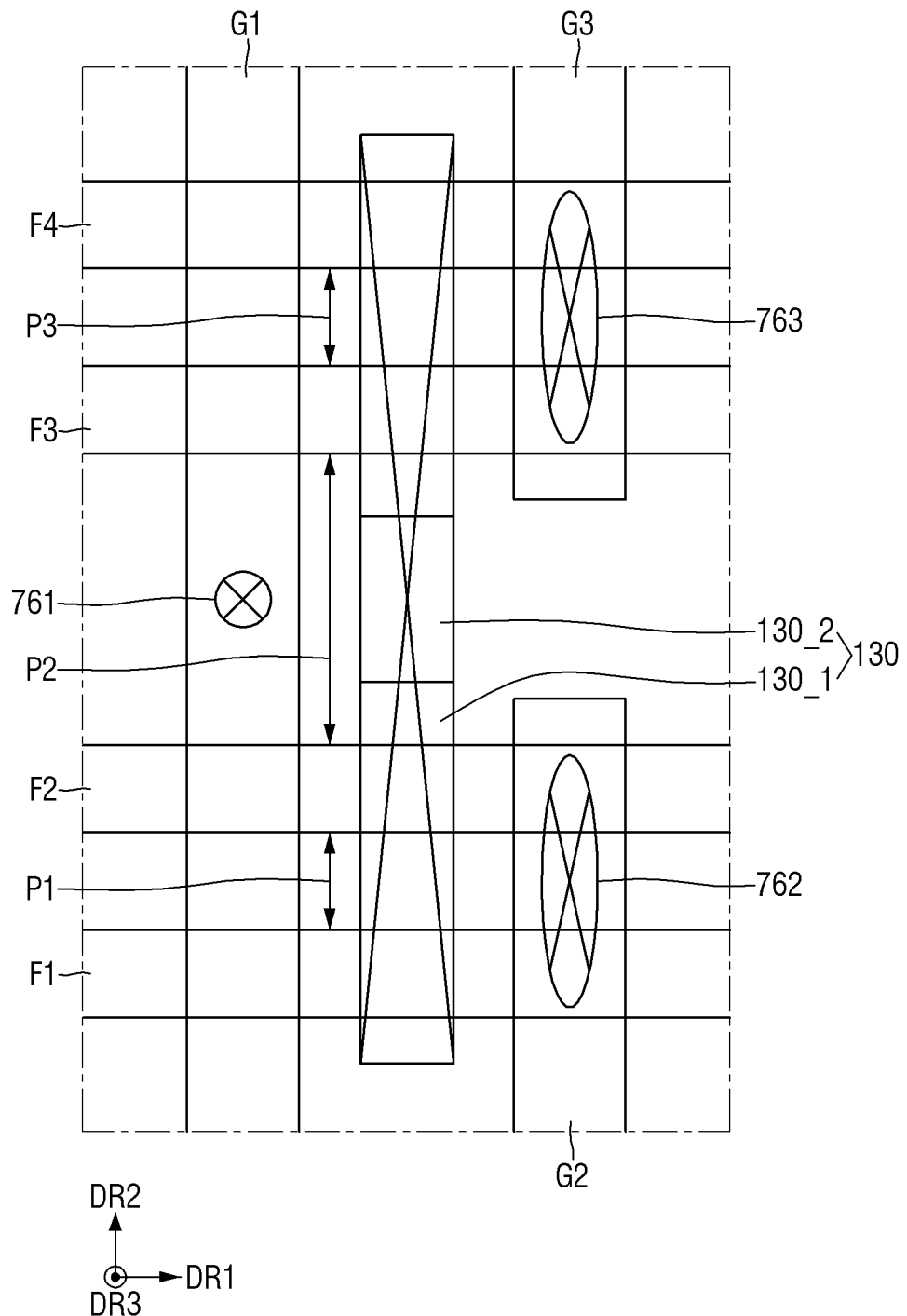
FIG. 16 is a layout diagram for explaining a semiconductor device according to some other embodiments of the present inventive concepts.

FIG. 16 is a layout diagram for explaining a semiconductor device according to some other embodiments of the present inventive concepts.

Referring to FIG. 16, in the semiconductor device according to some other embodiment of the present inventive concepts, a part of first to third gate contact 761, 762, and 763 may have a circular shape and the rest may have an elliptical shape, in the plane defined by the first horizontal direction DR1 and the second horizontal direction DR2.

For example, a first gate contact 761 may have a circular shape in the plane defined by the first horizontal direction DR1 and the second horizontal direction DR2. Further, each of second and third gate contacts 762 and 763 may have an elliptical shape having a major axis in the second horizontal direction DR2 in the plane defined by the first horizontal direction DR1 and the second horizontal direction DR2.

Hereinafter, a semiconductor device according to some other embodiments of the present inventive concepts will be described with reference to FIGS. 17 to 21. Differences from the semiconductor devices shown in FIGS. 1 to 6 will be mainly described.

Figure 17:
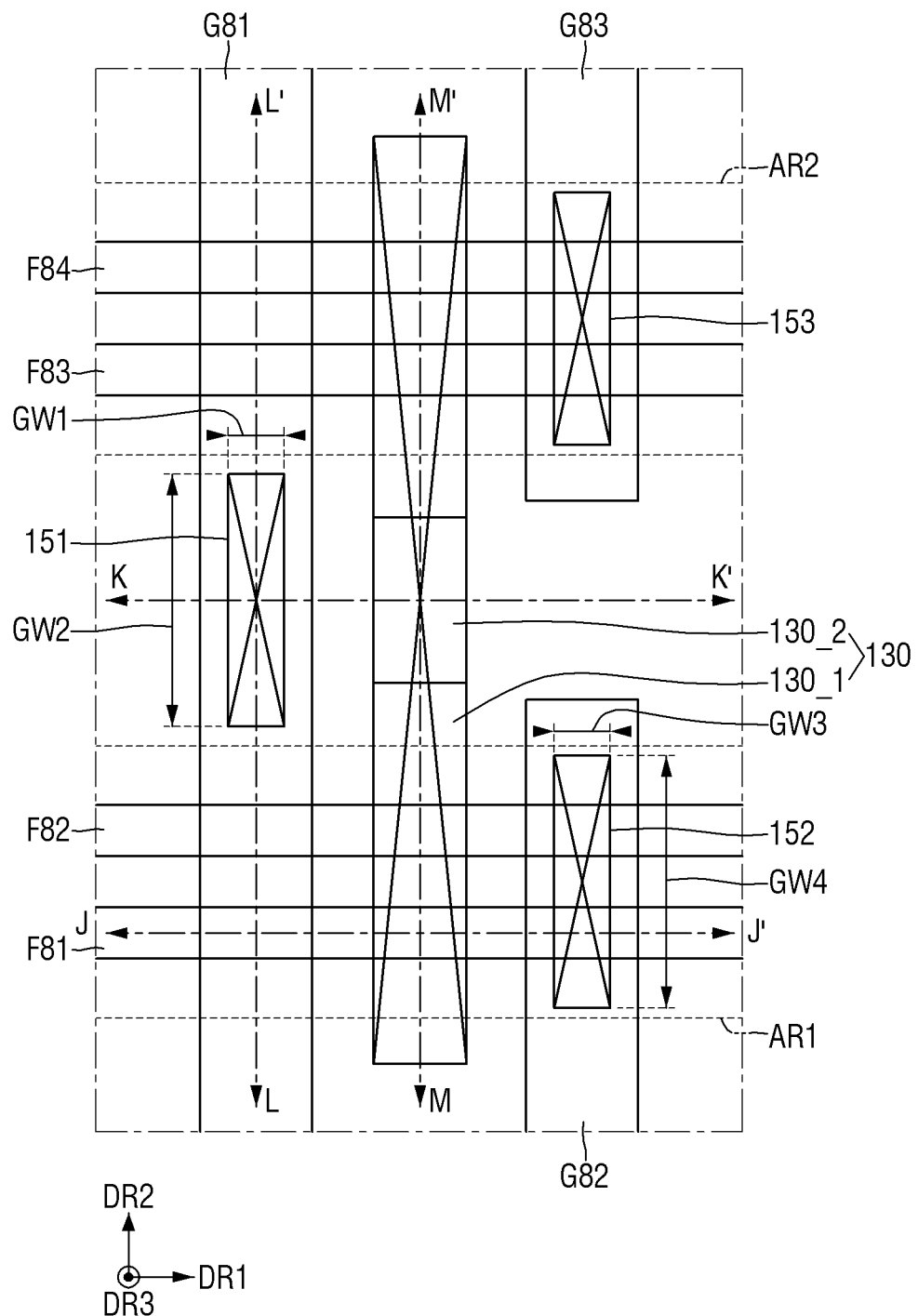
FIG. 17 is a layout diagram for explaining a semiconductor device according to some other embodiments of the present inventive concepts.
Figure 18:
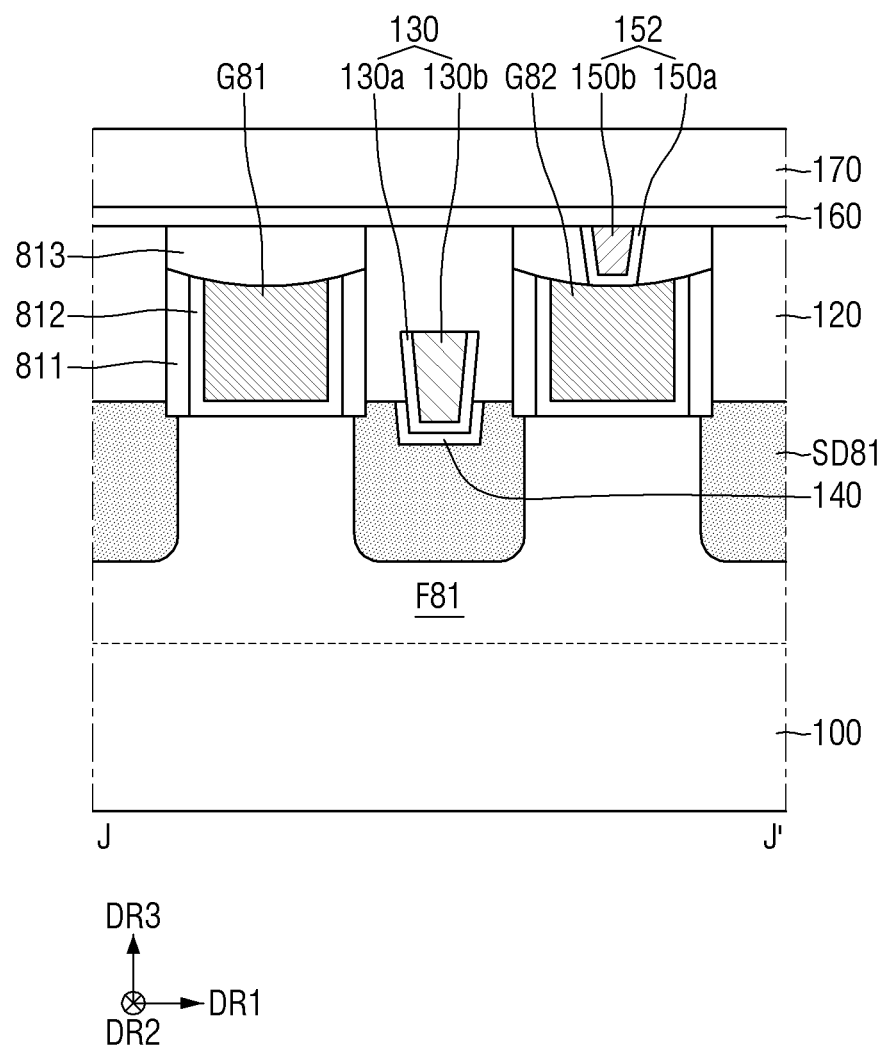
FIG. 18 is a cross-sectional view taken along a line J-J' of FIG. 17.
Figure 19:
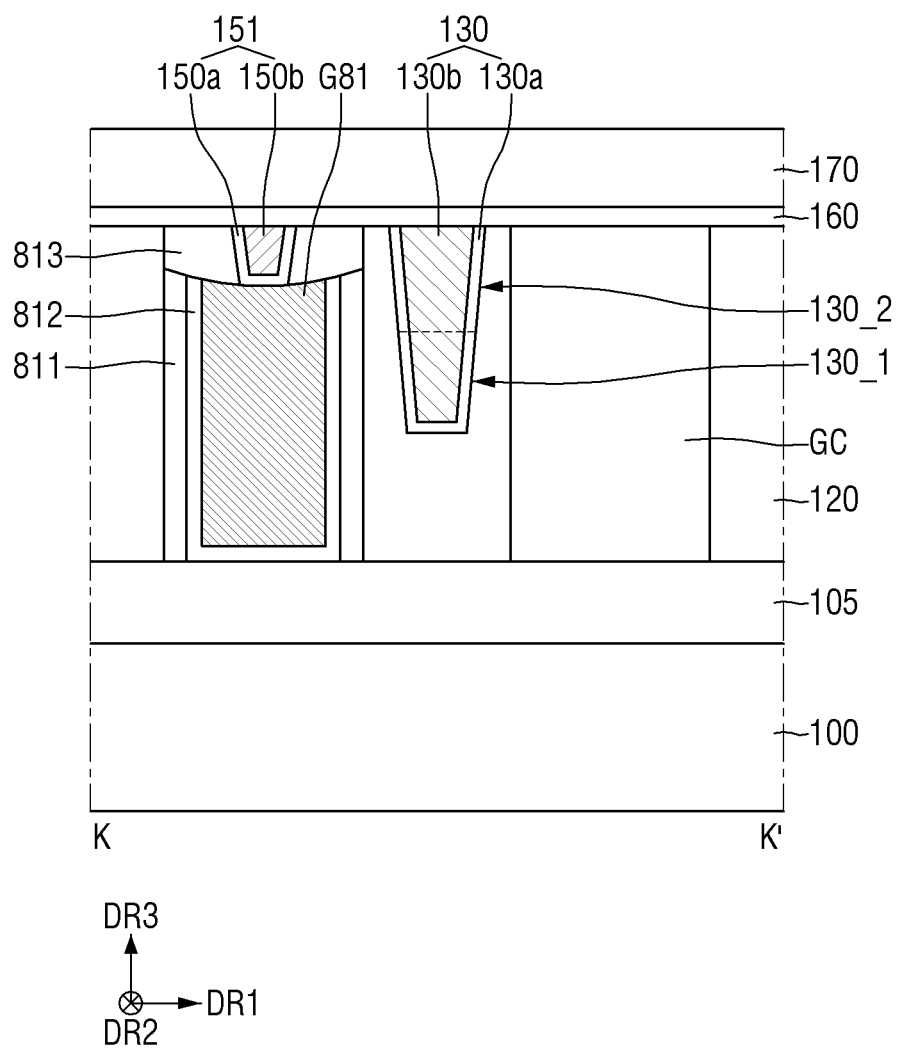
FIG. 19 is a cross-sectional view taken along a line K-K' of FIG. 17.
Figure 20:
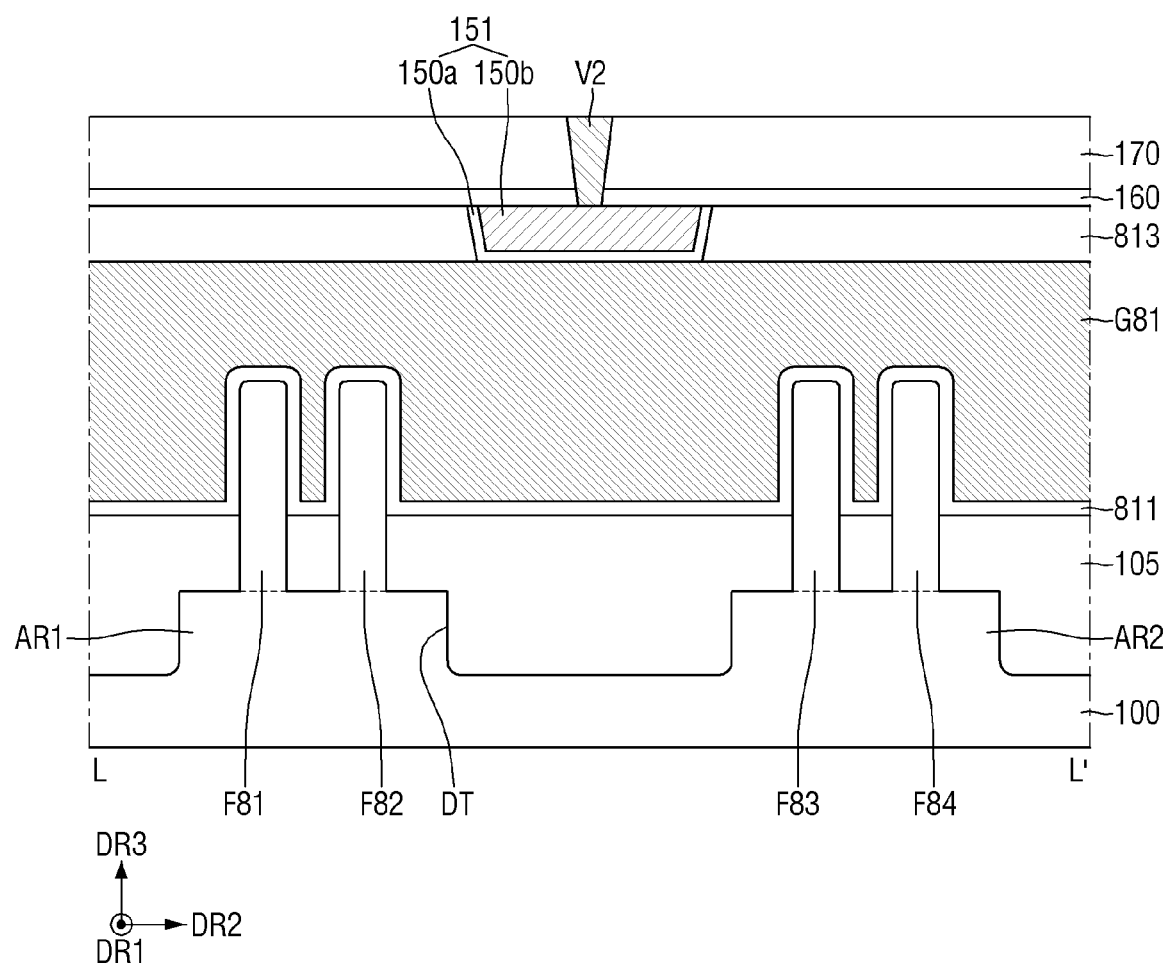
FIG. 20 is a cross-sectional view taken along a line L-L' of FIG. 17.
Figure 21:
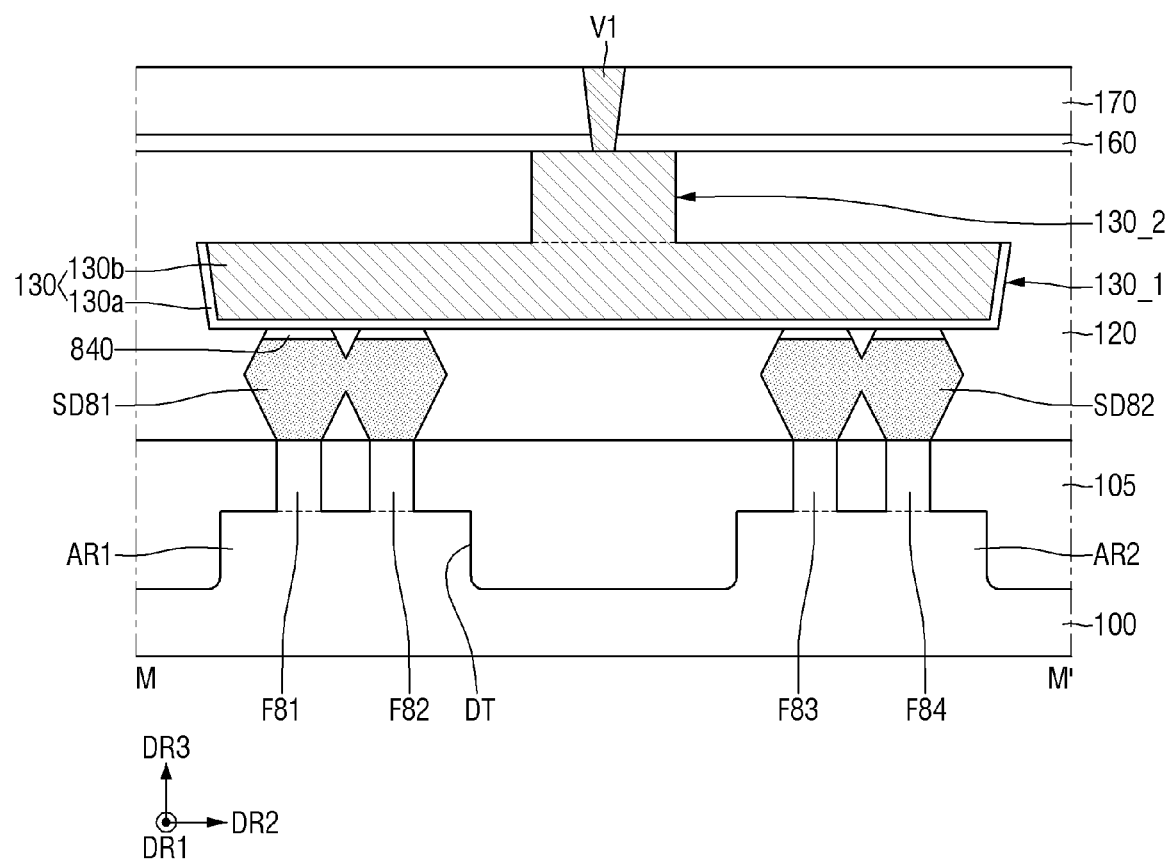
FIG. 21 is a cross-sectional view taken along a line M-M' of FIG. 17.

FIG. 17 is a layout diagram for explaining a semiconductor device according to some other embodiments of the present inventive concepts. FIG. 18 is a cross-sectional view taken along a line J-J' of FIG. 17. FIG. 19 is a cross-sectional view taken along a line K-K' of FIG. 17. FIG. 20 is a cross-sectional view taken along a line L-L' of FIG. 17. FIG. 21 is a cross-sectional view taken along a line M-M' of FIG. 17.

Referring to FIGS. 17 to 21, a semiconductor device according to some other embodiments of the present inventive concepts may include a fin-shaped transistor (FinFET). For example, the semiconductor device according to some other embodiments of the present disclosure may include a substrate 100, first to fourth active patterns F81, F82, F83, and F84, a field insulating layer 105, first to third gate electrodes G81, G82 and G83, a gate spacer 811, a gate insulating layer 812, a capping pattern 813, a gate cut GC, first and second source/drain regions SD81 and SD82, a first interlayer insulating layer 120, a source/drain contact 130, a silicide layer 140, first to third gate contacts 151, 152 and 153, an etching stop layer 160, a second interlayer insulating layer 170, a first via V1 and a second via V2. Hereinafter, the description of the configurations described in FIGS. 1 to 6 will not be provided.

Each of the first active region AR1 and the second active region AR2 may be disposed on the substrate 100. Each of the first active region AR1 and the second active region AR2 may protrude from the substrate 100 in the vertical direction DR3. Each of the first active region AR1 and the second active region AR2 may be defined by a deep trench DT formed on the substrate 100. Each of the first active region AR1 and the second active region AR2 may extend in the first horizontal direction DR1. The second active region AR2 may be spaced apart from the first active region AR1 in the second horizontal direction DR2.

Each of the first and second active patterns F81 and F82 may be disposed on the first active region AR1. Each of the first and second active patterns F81 and F82 may protrude from the first active region AR1 in the vertical direction DR3. Each of the first and second active patterns F81 and F82 may extend in the first horizontal direction DR1. The second active pattern F82 may be spaced apart from the first active pattern F81 in the second horizontal direction DR2.

Each of the third and fourth active patterns F83 and F84 may be disposed on the second active region AR2. Each of the third and fourth active patterns F83 and F84 may protrude from the second active region AR2 in the vertical direction DR3. Each of the third and fourth active patterns F83 and F84 may extend in the first horizontal direction DR1. The fourth active pattern F84 may be spaced apart from the third active pattern F83 in the second horizontal direction DR2.

The first gate electrode G81 may extend in the second horizontal direction DR2 on the field insulating layer 105, and the first to fourth active patterns F81, F82, F83, and F84. The second gate electrode G82 may extend in the second horizontal direction DR2 on the field insulating layer 105, and the first and second active patterns F81 and F82. The second gate electrode G82 may be spaced apart from the first gate electrode G81 in the first horizontal direction DR1. The third gate electrode G83 may extend in the second horizontal direction DR2 on the field insulating layer 105, and the third and fourth active patterns F83 and F84. The third gate electrode G83 may be spaced apart from the first gate electrode G81 in the first horizontal direction DR1. The third gate electrode G83 may be spaced apart from the second gate electrode G82 in the second horizontal direction DR2.

The gate spacer 811 may extend in the second horizontal direction DR2 along the side walls of each of the first to third gate electrodes G81, G82, and G83 on the field insulating layer 105. The gate spacer 811 may extend in the second horizontal direction DR2 along the side walls of each of the first to third gate electrodes G81, G82 and G83 on the first to fourth active patterns F81, F82, F83 and F84.

The gate insulating layer 812 may be disposed between each of the first to third gate electrodes G81, G82, and G83 and the gate spacer 811. The gate insulating layer 812 may be disposed between each of the first to third gate electrodes G81, G82, and G83 and each of the first to fourth active patterns F81, F82, F83, and F84. The gate insulating layer 812 may be disposed between each of the first to third gate electrodes G81, G82 and G83 and the field insulating layer 105.

A first source/drain region SD81 may be disposed on at least one side of each of the first and second gate electrodes G81 and G82 on each of the first and second active patterns F81 and F82. A second source/drain region SD82 may be disposed on at least one side of each of the first and third gate electrodes G81 and G83 on each of the third and fourth active patterns F83 and F84.

The first source/drain region SD81 disposed on the first and second active patterns F81 and F82 may have a merged shape. Further, a second source/drain region SD82 disposed on the third and fourth active patterns F83 and F84 may have a merged shape. A silicide layer 840 may be disposed between the first source/drain region SD81 and the source/drain contact 130, and between the second source/drain region SD82 and the source/drain contact 130.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
   a first active pattern which extends in a first horizontal direction;
   a second active pattern which extends in the first horizontal direction, and is spaced apart from the first active pattern by a first distance in a second horizontal direction different from the first horizontal direction;
   a third active pattern which extends in the first horizontal direction, and is spaced apart from the second active pattern by a second distance greater than the first distance in the second horizontal direction;
   a first gate electrode which extends in the second horizontal direction on the first to third active patterns;
   a second gate electrode which extends in the second horizontal direction on the first and second active patterns, and is spaced apart from the first gate electrode in the first horizontal direction;
   a first gate contact on the first gate electrode, wherein the first gate contact is in direct contact with the first gate electrode; and
   a second gate contact which extends in the second horizontal direction on the second gate electrode, wherein the second gate contact is in direct contact with the second gate electrode, and wherein the second gate contact has a width in the first horizontal direction that is less than a width in the second horizontal direction.

2. The semiconductor device of claim 1, wherein the second gate contact overlaps each of the first and second active patterns in a vertical direction that is perpendicular to the first horizontal direction.

3. The semiconductor device of claim 1,
   wherein the first gate contact extends in the second horizontal direction between the second active pattern and the third active pattern, and
   wherein a width of the first gate contact in the first horizontal direction is less than a width of the first gate contact in the second horizontal direction.

4. The semiconductor device of claim 1, wherein a width of the first gate contact in the first horizontal direction is equal to a width of the first gate contact in the second horizontal direction.

5. The semiconductor device of claim 4, wherein the first gate contact is between the second active pattern and the third active pattern.

6. The semiconductor device of claim 4, wherein the first gate contact overlaps the second gate contact in the first horizontal direction.

7. The semiconductor device of claim 1,
   wherein the first gate contact overlaps each of the first and second active patterns in a vertical direction that is perpendicular to the first horizontal direction, and extends in the second horizontal direction, and
   wherein a width of the first gate contact in the first horizontal direction is less than a width of the first gate contact in the second horizontal direction.

8. The semiconductor device of claim 1, further comprising:
   a first source/drain region on the first active pattern between the first gate electrode and the second gate electrode;
   a second source/drain region on the third active pattern on a first side of the first gate electrode; and
   a source/drain contact on the first and second source/drain regions, and in direct contact with each of the first and second source/drain regions, wherein the source/drain contact comprises a first portion and a second portion protruding from the first portion in a vertical direction that is perpendicular to the first horizontal direction,
   wherein a width of the second portion of the source/drain contact in the second horizontal direction is less than a width of the first portion of the source/drain contact in the second horizontal direction.

9. The semiconductor device of claim 8, wherein the source/drain contact comprises:
   a first source/drain contact on the first source/drain region,
   a second source/drain contact on the second source/drain region, and spaced apart from the first source/drain contact in the second horizontal direction.

10. The semiconductor device of claim 1, wherein the second gate contact has an elliptical shape in a plane defined by the first and second horizontal directions.

11. The semiconductor device of claim 1, further comprising:
    a plurality of nanosheets stacked on the first active pattern that are spaced apart from each other in a vertical direction that is perpendicular to the first horizontal direction and in the first gate electrode.

12. A semiconductor device comprising:
    a first active pattern which extends in a first horizontal direction;
    a second active pattern which extends in the first horizontal direction, and is spaced apart from the first active pattern by a first distance in a second horizontal direction different from the first horizontal direction;

a third active pattern which extends in the first horizontal direction, and is spaced apart from the second active pattern by a second distance greater than the first distance in the second horizontal direction;

a first gate electrode which extends in the second horizontal direction on the first and second active patterns;

a second gate electrode which extends in the second horizontal direction on the third active pattern, and is spaced apart from the first gate electrode in the second horizontal direction;

a first source/drain region on the first active pattern on a first side of the first gate electrode;

a second source/drain region on the third active pattern on a first side of the second gate electrode;

a source/drain contact on the first and second source/drain regions, and in direct contact with each of the first and second source/drain regions, wherein the source/drain contact comprises a first portion and a second portion protruding from the first portion in a vertical direction that is perpendicular to the first horizontal direction; and a first gate contact which extends in the second horizontal direction on the first gate electrode, is in direct contact with the first gate electrode, has a width in the first horizontal direction less than a width in the second horizontal direction, and overlaps the first portion of the source/drain contact in the first horizontal direction.

13. The semiconductor device of claim 12, further comprising:

a second gate contact which extends in the second horizontal direction on the second gate electrode, is in direct contact with the second gate electrode, has a width in the first horizontal direction less than a width in the second horizontal direction, and overlaps the first portion of the source/drain contact in the first horizontal direction.

14. The semiconductor device of claim 12, wherein the first gate contact overlaps each of the first and second active patterns in the vertical direction.

15. The semiconductor device of claim 12, wherein the second portion of the source/drain contact is between the second active pattern and the third active pattern.

16. The semiconductor device of claim 15, wherein the first gate contact does not overlap the second portion of the source/drain contact in the first horizontal direction.

17. The semiconductor device of claim 12, wherein the source/drain contact comprises:

a first source/drain contact on the first source/drain region, and a second source/drain contact on the second source/drain region and spaced apart from the first source/drain contact in the second horizontal direction.

18. The semiconductor device of claim 12, further comprising:

a third gate electrode which extends in the second horizontal direction on the first to third active patterns, and is spaced apart from each of the first and second gate electrodes in the first horizontal direction; and a third gate contact which is on the third gate electrode between the second active pattern and the third active pattern, is in direct contact with the third gate electrode, and overlaps the second portion of the source/drain contact in the first horizontal direction.

19. The semiconductor device of claim 18, wherein the third gate contact extends in the second horizontal direction, and a width of the third gate contact in the first horizontal direction is less than a width of the third gate contact in the second horizontal direction.

20. A semiconductor device comprising:

a first active pattern which extends in a first horizontal direction;

a second active pattern which extends in the first horizontal direction, and is spaced apart from the first active pattern by a first distance in a second horizontal direction different from the first horizontal direction;

a third active pattern which extends in the first horizontal direction, and is spaced apart from the second active pattern by a second distance greater than the first distance in the second horizontal direction;

a first plurality of nanosheets stacked on the first active pattern which are spaced apart from each other in a vertical direction that is perpendicular to the first horizontal direction;

a second plurality of nanosheets stacked on the third active pattern which are spaced apart from each other in the vertical direction;

a first gate electrode which extends in the second horizontal direction on the first to third active patterns, wherein the first and second plurality of nanosheets are in the first gate electrode;

a second gate electrode which extends in the second horizontal direction on the first and second active patterns, and is spaced apart from the first gate electrode in the first horizontal direction, wherein the first plurality of nanosheets are in second gate electrode;

a first source/drain region on the first active pattern between the first gate electrode and the second gate electrode;

a second source/drain region on the third active pattern on a first side of the first gate electrode;

a source/drain contact which is on the first and second source/drain regions, in direct contact with each of the first and second source/drain regions, and the source/drain contact comprises a first portion and a second portion protruding from the first portion in the vertical direction;

a first gate contact which extends in the second horizontal direction on the first gate electrode, is in direct contact with the first gate electrode, and has a width in the first horizontal direction less than a width in the second horizontal direction; and a second gate contact which extends in the second horizontal direction on the second gate electrode, is in direct contact with the second gate electrode, has a width in the first horizontal direction less than a width in the second horizontal direction, and overlaps each of the first and second active patterns in the vertical direction.

* * * * *